United States Patent
Shaw

(10) Patent No.: US 10,877,218 B2
(45) Date of Patent: Dec. 29, 2020

(54) PHOTONIC DEVICES AND METHODS FOR FORMATION THEREOF

(71) Applicant: STMicroelectronics S.r.l., Agrate Brianza (IT)

(72) Inventor: Mark Andrew Shaw, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/365,566

(22) Filed: Mar. 26, 2019

(65) Prior Publication Data

US 2020/0310031 A1  Oct. 1, 2020

(51) Int. Cl.
*G02B 6/13*  (2006.01)
*G02B 6/136*  (2006.01)
*H01L 21/78*  (2006.01)

(52) U.S. Cl.
CPC ............. *G02B 6/136* (2013.01); *H01L 21/78* (2013.01)

(58) Field of Classification Search
CPC ........ G02B 6/4214; G02B 6/136; H01L 21/78
See application file for complete search history.

(56) References Cited

U.S. PATENT DOCUMENTS

| | | |
|---|---|---|
| 5,926,586 A | 7/1999 | Dragone et al. |
| 6,066,513 A * | 5/2000 | Pogge ............... H01L 21/30608 257/E21.223 |
| 6,208,791 B1 | 3/2001 | Bischel et al. |
| 7,927,916 B2 * | 4/2011 | Lake |
| 7,953,305 B2 | 5/2011 | Sugiyama |
| 8,149,891 B2 * | 4/2012 | Funabashi ................ G02B 6/42 372/50.1 |
| 9,130,057 B1 | 9/2015 | Kumar et al. |
| 9,544,573 B2 * | 1/2017 | Carminati et al. |
| 10,132,997 B2 * | 11/2018 | Mahgerefteh ........ G02B 6/2726 |
| 2001/0028768 A1 * | 10/2001 | Terashima ............... G02B 6/42 385/49 |
| 2004/0013378 A1 | 1/2004 | Lee et al. |
| 2004/0169258 A1 * | 9/2004 | Iijima ..................... H01L 22/32 257/620 |
| 2006/0274314 A1 | 12/2006 | Thomsen et al. |

(Continued)

FOREIGN PATENT DOCUMENTS

WO  2012006736 A2  1/2012

OTHER PUBLICATIONS

La Porta et al, "Optical Coupling between Polymer Waveguides and a Silicon Photonics Chip in the O-band," in Optical Fiber Communication Conference, OSA Technical Digest (online) (Optical Society of America, 2016), paper M21.2. (Year: 2016).*

(Continued)

*Primary Examiner* — Peter Radkowski
(74) *Attorney, Agent, or Firm* — Slater Matsil, LLP

(57) ABSTRACT

A method of forming a photonic device includes forming a cavity extending from a first major surface of a semiconductor wafer, performing a laser grooving process to form a first groove and a second groove, dicing the semiconductor wafer along the first groove and the second groove, and attaching an optical interposer to the bottom surface of the cavity. The cavity includes a first sidewall, an opposite second sidewall, and a bottom surface. The first groove is separated from the second groove by the cavity. The dicing passes through the cavity along a line connecting the first groove to the second groove.

23 Claims, 30 Drawing Sheets

(56) References Cited

U.S. PATENT DOCUMENTS

| | | | |
|---|---|---|---|
| 2008/0129623 A1 | 6/2008 | Barry | |
| 2008/0246066 A1* | 10/2008 | Lake | |
| 2009/0067786 A1 | 3/2009 | Ohtsu et al. | |
| 2009/0067799 A1 | 3/2009 | Nakane | |
| 2009/0108410 A1* | 4/2009 | Takemura | H01L 21/78 257/620 |
| 2010/0104251 A1 | 4/2010 | Hodono et al. | |
| 2010/0215072 A1* | 8/2010 | Funabashi | G02B 6/42 372/50.12 |
| 2010/0278485 A1 | 11/2010 | Nakagawa et al. | |
| 2012/0076454 A1 | 3/2012 | Shiraishi | |
| 2012/0211748 A1* | 8/2012 | Miccoli | B23K 26/032 257/52 |
| 2013/0015578 A1* | 1/2013 | Thacker | H01L 24/13 257/738 |
| 2013/0170803 A1 | 7/2013 | Mori et al. | |
| 2014/0179083 A1 | 6/2014 | Buenning et al. | |
| 2014/0198366 A1* | 7/2014 | Carminati et al. | |
| 2015/0069578 A1 | 3/2015 | Buenning et al. | |
| 2015/0108506 A1 | 4/2015 | Zhang et al. | |
| 2016/0059354 A1* | 3/2016 | Sercel | B23K 26/38 264/400 |
| 2017/0329081 A1* | 11/2017 | Mahgerefteh | G02B 6/2726 |
| 2018/0233410 A1* | 8/2018 | James | H01L 21/78 |
| 2018/0267265 A1* | 9/2018 | Zhang | G02B 6/3825 |
| 2018/0335591 A1 | 11/2018 | Fincato et al. | |
| 2019/0086609 A1 | 3/2019 | Shaw | |

OTHER PUBLICATIONS

Roger Dangel, Jens Hofrichter, Folkert Horst, Daniel Jubin, Antonio La Porta, Norbert Meier, Ibrahim Murat Soganci, Jonas Weiss, and Bert Jan Offrein, "Polymer waveguides for electro-optical integration in data centers and high-performance computers," Opt. Express 23, 4736-4750 (2015) (Year: 2015).*

Riccardo Marchetti, Cosimo Lacava, Lee Carroll, Kamil Gradkowski, and Paolo Minzioni, "Coupling strategies for silicon photonics integrated chips [Invited]," Photon. Res. 7, 201-239 (2019) (Year: 2019).*

Qing Fang, Tsung-Yang Liow, Jun Feng Song, Chee Wei Tan, Ming Bin Yu, Guo Qiang Lo, and Dim-Lee Kwong, "Suspended optical fiber-to-waveguide mode size converter for Silicon photonics," Opt. Express 18, 7763-7769 (2010) (Year: 2010).*

Yutaka Urino, Tatsuya Usuki, Junichi Fujikata, Masashige Ishizaka, Koji Yamada, Tsuyoshi Horikawa, Takahiro Nakamura, and Yasuhiko Arakawa, "High-density and wide-bandwidth optical interconnects with silicon optical interposers [Invited]," Photon. Res. 2 , A1-A7 (2014) (Year: 2014).*

Disco, Low-k Grooving, http://www.discousa.com/eg/solution/library/low_k.html, (Year: 2004).*

Hooper, Andy, Review of wafer discing techniques for via-middle process 3D1/TSV ultrathin silicon device wafers, 2015 Electronic Components & Technology Conference (Year: 2015).*

Boeuf, Frederic, et al., "Challenges in Silicon Photonics Process Technology," 2017 European Conference on Optical Communication (ECOC), IEEE, 2017, 3 pages.

Boyer, N. et al., "Sub-Micron Bondline-Shape Control in Automated Assembly of Photonic Devices," 2016 IEEE 66th Electronic Components and Technology Conference, 2016, 7 pages.

Disco Corporation, "Laser Application," www.disco.co.jp, Aug. 2017, 10 pages.

Guerber, Sylvain, et al., "Integrated SiN on SOI dual photonic devices for advanced datacom solutions," Silicon Photonics, Fundamental Research to Manufacturing, vol. 10686, International Society for Optics and Photonics, 2018, 8 pages.

Klug, G., "Solutions for thin and tiny dies with high die strength and for thinning WLCSP and eWLB wafers," Semicon Europa, Disco Hi-Tec Europe Gmbh, Munich, Germany, Nov. 14-17, 2017, 26 pages.

Bettotti, Paolo, "Hybrid Materials for Integrated Photonics", Advances in Optics, vol. 2014, Article ID 891395, published Jun. 26, 2014, 24 pages.

Creazzo, Timothy, et al., "Integrated tunable CMOS laser", OSA Publishing, Optics Express, vol. 21, No. 23, Nov. 18, 2013, pp. 28048-28053.

Dhoore, Soren, et al., "Novel adiabatic tapered couplers for active III-V/SOI devices fabricated through transfer printing", Optics Express, vol. 24, No. 12, Jun. 13, 2016, pp. 12976-12990.

La Porta, A., et al., "Silicon Photonics Packaging for Highly Scalable Optical Interconnects", 2015 IEEE 65th Electronic Components and Technology Conference (ECTC), pp. 1299-1304.

Acker, Matthew S., "The Back-End Process: Step 11—Scribe and Break", Dynatex International, downloaded from Internet on Sep. 13, 2018, http://www.dynatex.com/dtx-scribe-and-break_8_108_26213.html.

Disco Corporation, "Stealth Dicing Application", downloaded from Internet on Sep. 13, 2018, https://www.disco.co.jp/eg/solution/library/stealth.html.

Dynatex International, "Laser Bar Cleaving for High Volume Production", downloaded from Internet on Sep. 13, 2018, http://www.dynatex.com/dtx-scribe-and-break_8_108_26213.html.

Kumagai, Masayoshi, et al., "Advanced Dicing Technology for Semiconductor Wafer-Stealth Dicing", IEEE Transactions on Semiconductor Manufacturing, vol. 20, No. 3, Aug. 2007, pp. 259-265.

Kumagai, Masayoshi, et al., "Advanced dicing technology for semiconductor wafer-Stealth Dicing", Semiconductor Manufacturing, 2006, IEEE International Symposium, Piscataway, NJ, Sep. 25, 2006, pp. 215-218.

Ohmura, Etsuji, et al., "Analysis of Internal Crack Propagation in Silicon Due to Permeable Pulse Laser Irradiation: Study on Processing Mechanism of Stealth Dicing", Journal of Materials Science and Engineering A 1, David Publishing, Jun. 10, 2011, pp. 46-52.

Yadav, Amit, et al., "Stealth dicing of sapphire wafers with near infra-red femtosecond pulses", Applied Physics A, Materials Science & Processing, Apr. 25, 2017, 7 pages.

Taira, Yoichi, et al., "Improved Connectorization of Compliant Polymer Waveguide Ribbon for Silicon Nanophotonics Chip Interfacing to Optical Fibers", 2015 IEEE 65th Electronic Components and Technology Conference (ECTC), May 26-29, 2015 San Diego, CA, USA, 6 pages.

Beng, Lau Teck, et al., "Laser Grooving Process Development for Low-k / Ultra Low-k Devices," 2008 33rd IEEE/CPMT International Electronics Manufacturing Technology Conference (IEMT), Nov. 4-6, 2008, Penang, Malaysia, 6 pages.

* cited by examiner

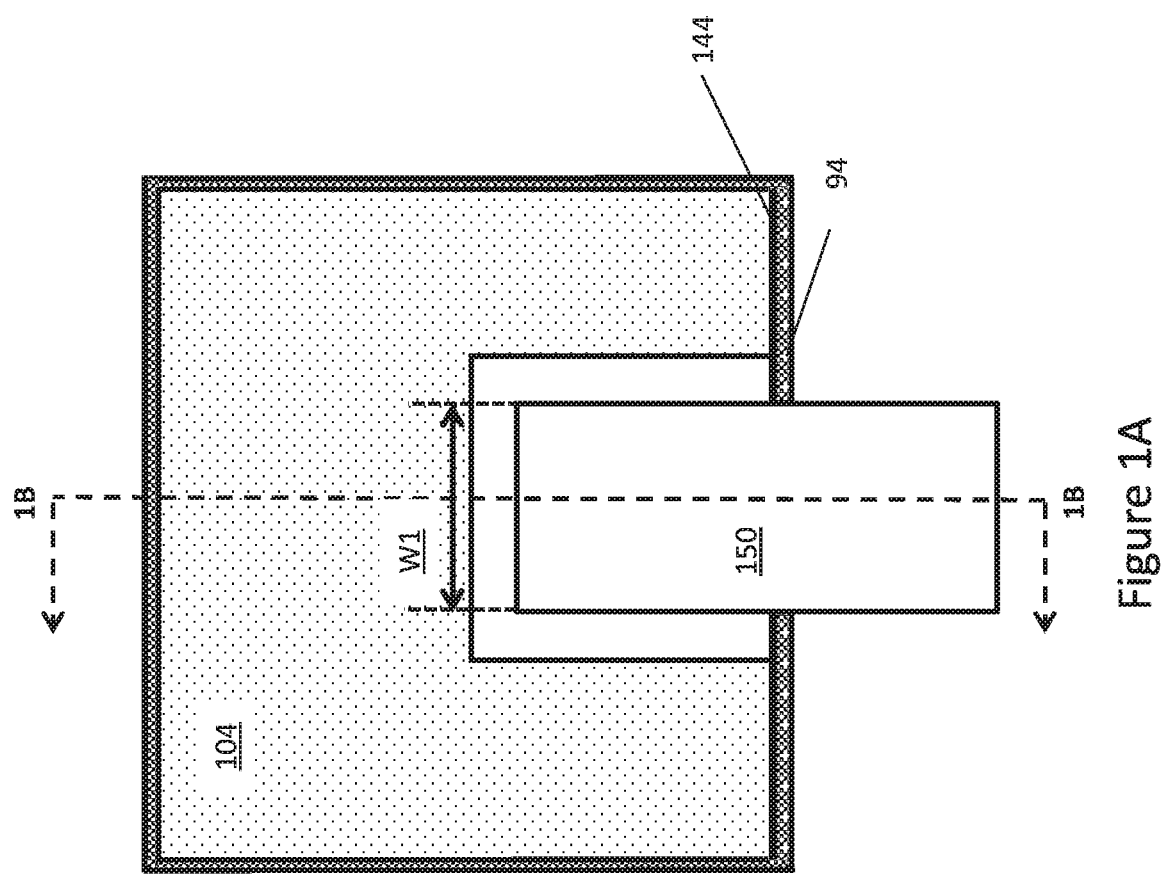

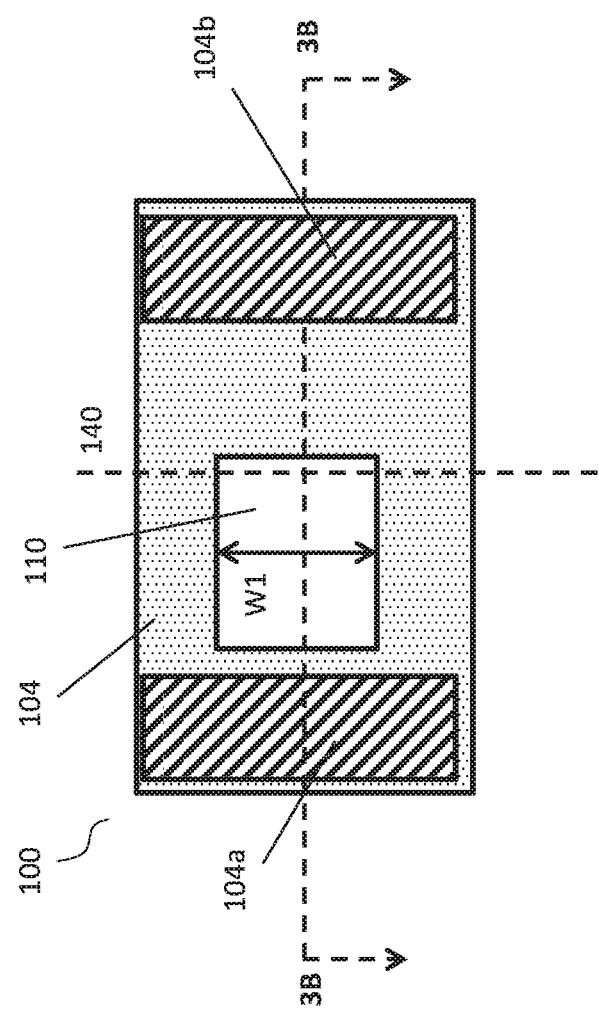

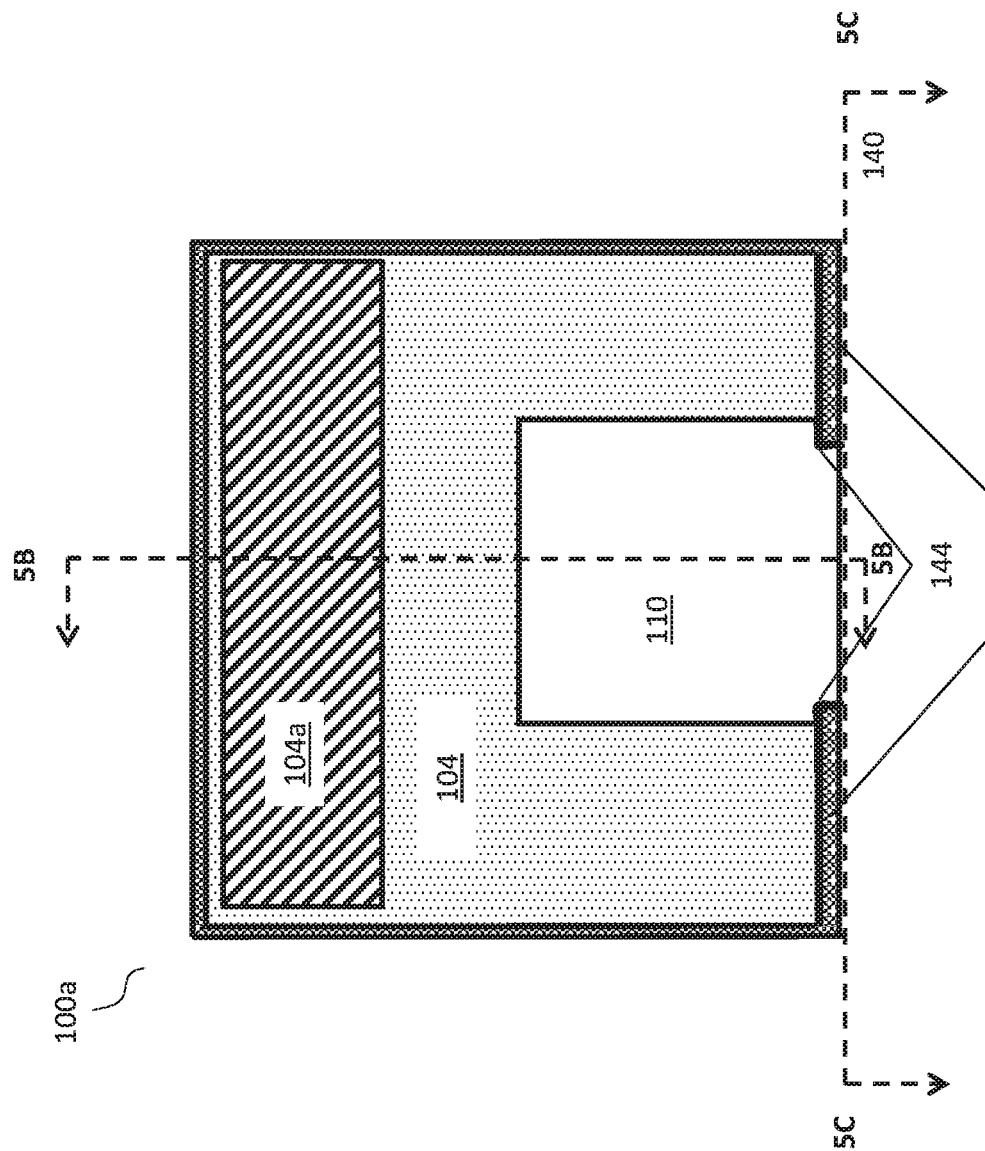

US 10,877,218 B2

PHOTONIC DEVICES AND METHODS FOR FORMATION THEREOF

TECHNICAL FIELD

The present invention relates generally to a semiconductor device, and, in particular embodiments, to photonic devices and methods for formation thereof.

BACKGROUND

In applications involving silicon photonics, optical inputs/output arrangements may be realized, via an adiabatic or "evanescent" coupling. The term adiabatic coupling refers to the fact that transition occurs substantially without loss of energy.

Adiabatic or "evanescent" coupling may involve one or more optical layers realized in, e.g., an optical integrated circuit (OIC) and one or more optical layers realized, e.g., in a medium/support/interposer, external to the OIC. The external medium may be conventionally attached by gluing to the OIC. Setting the distance between the optical layer(s) of the OIC and an external medium/support/interposer to a certain value facilitates making the adiabatic or evanescent coupling effective. The working principle of such a coupling is based on asymmetric directional couplers (DC), wherein each waveguide changes its cross section and/or refractive index along a direction of propagation.

Certain types of coupling between polymer waveguides and a silicon photonics based chip (as disclosed, e.g., in Y. Taira et al., "Improved Connectorization of Compliant Polymer Waveguide Ribbon for Silicon Nanophotonics Chip Interfacing to Optical Fibers," 2015 IEEE 65th Electronic Components and Technology Conference (ECTC), 26-29, May 2015 San Diego, Calif., USA) involve an optical flex attached on top of a photonic chip, with the presence of only one optical layer, without addressing issue of providing of a back end of line (BEOL).

SUMMARY

In accordance with an embodiment of the invention, a method of forming a photonic device includes forming a cavity extending from a first major surface of a semiconductor wafer, performing a laser grooving process to form a first groove and a second groove, dicing the semiconductor wafer along the first groove and the second groove, and attaching an optical interposer to the bottom surface of the cavity. The cavity includes a first sidewall, an opposite second sidewall, and a bottom surface. The first groove is separated from the second groove by the cavity. The dicing passes through the cavity along a line connecting the first groove to the second groove.

In accordance with another embodiment of the invention, a method of forming a photonic device includes forming a cavity extending from a first major surface of a semiconductor wafer, forming a first trench and a second trench, dicing the semiconductor wafer along the first trench and the second trench, and attaching an optical interposer to the bottom surface of the cavity. The cavity includes a first sidewall, an opposite second sidewall, and a bottom surface. The first trench is separated from the second trench by the cavity. The dicing passes through the cavity along a line connecting the first trench to the second trench.

In accordance with still another embodiment of the invention, a photonic device includes a major surface including a first cavity extending into the photonic device. The first cavity includes sidewalls on a first side, a second side, and a third side. The first cavity is open on a fourth side. The photonic device further includes an optical interposer attached to a bottom surface of the first cavity, a first residual material disposed at a first side of the first cavity, and a second residual material disposed at a third side of the first cavity.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A and 1B illustrate top and cross-sectional views, respectively, of an structure formed in a conventional process;

FIGS. 3A and 3B illustrate a top view and a cross-sectional view, respectively, a semiconductor wafer during various stages of assembly/fabrication in accordance with some embodiments;

FIG. 5A illustrates a top view of a semiconductor chip during various stages of assembly/fabrication in accordance with some embodiments;

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Figure 1B:
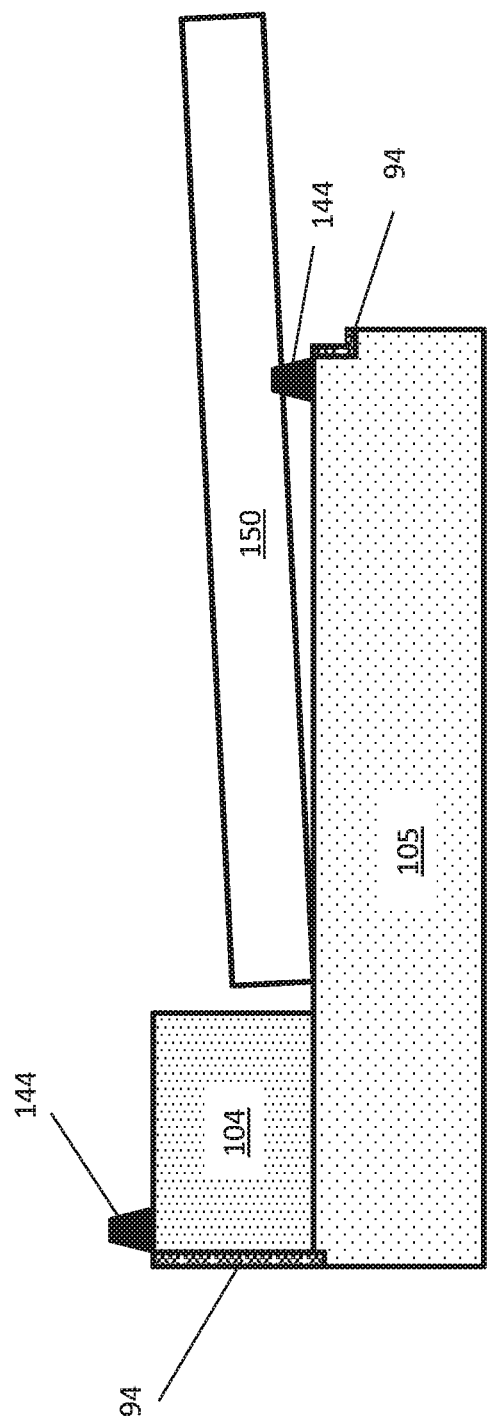

The references used herein are provided merely for convenience and hence do not define the extent of protection or the scope of the embodiments. In order to fabricate some optical apparatuses, an optical interposer needs to be assembled at an individual package level so that light with a broadband spectrum can be coupled to a semiconductor photonics chip. The optical interposer may comprise a rigid optical medium such as glass. Prior to wafer dicing, a cavity is formed in each semiconductor photonics chip in a wafer to provide a coupling location for the optical interposer. To avoid delamination of the metallization layers of the semiconductor photonics chip, a groove is formed using a laser ablation process along the scribe lines prior to dicing. The presence of the groove mitigates cracking and/or delamination of the metallization layers that are present in the scribe line, for example, test structures. However, the laser ablation process used to form the groove leaves a residue along both sidewalls of the groove. Even after the subsequent dicing, some of the residue may remain proximate the diced sidewall of the photonics chip. Consequently, when the interposer is mounted onto the photonics chip, the residue prevents adiabatic coupling between the components of the photonics chip and the interposer. In other words, this residue from the laser ablation process may produce a tilt in the optical interposer when coupled to the bottom surface of the cavity, giving rise to poor optical coupling. This problem is illustrated by FIGS. 1A and 1B described further below. FIG. 1A illustrates a top view of a structure formed using a conventional process in which a semiconductor photonics chip has been coupled to an optical interposer 150. FIG. 1B is illustrated in a cross-sectional view of the semiconductor photonics chip along cross-section 1B-1B. The semiconductor photonics chip has a BEOL layer 104 formed on a substrate 105. Residual material 144 from the forming of groove 94 by laser ablation causes the above-described problem of a poor optical coupling between the semiconductor photonics chip and the optical interposer 150. A conventional process for laser grooving is disclosed in L. T. Beng et al., "Laser grooving process development for low-k/ultra low-k devices," 2008 $33^{rd}$ IEEE/CPMT International Electronics Manufacturing Technology Conference (TEMT), 4-6 Nov. 2008, Penang, Malaysia.

Embodiments of the invention disclosed herein provide solutions to this problem of raised residual material for photonic devices assembled with semiconductor photonics chips coupled to optical interposers. FIGS. 2-7 illustrate a photonic device during various stages of fabrication in accordance with a first method embodiment of the invention. FIG. 7 illustrates a method 1000 of fabricating a photonic device as depicted in FIGS. 2-6, in accordance with an embodiment of the invention.

In this embodiment, a plurality of grooves is formed along a scribe line of the semiconductor photonics wafer such that it ends at the boundaries of the cavity for mounting the interposer. Consequently, the laser ablation does not leave any residual material in most of the surface of the cavity allowing the interposer to be able to contact the underlying surface.

Figure 2A:
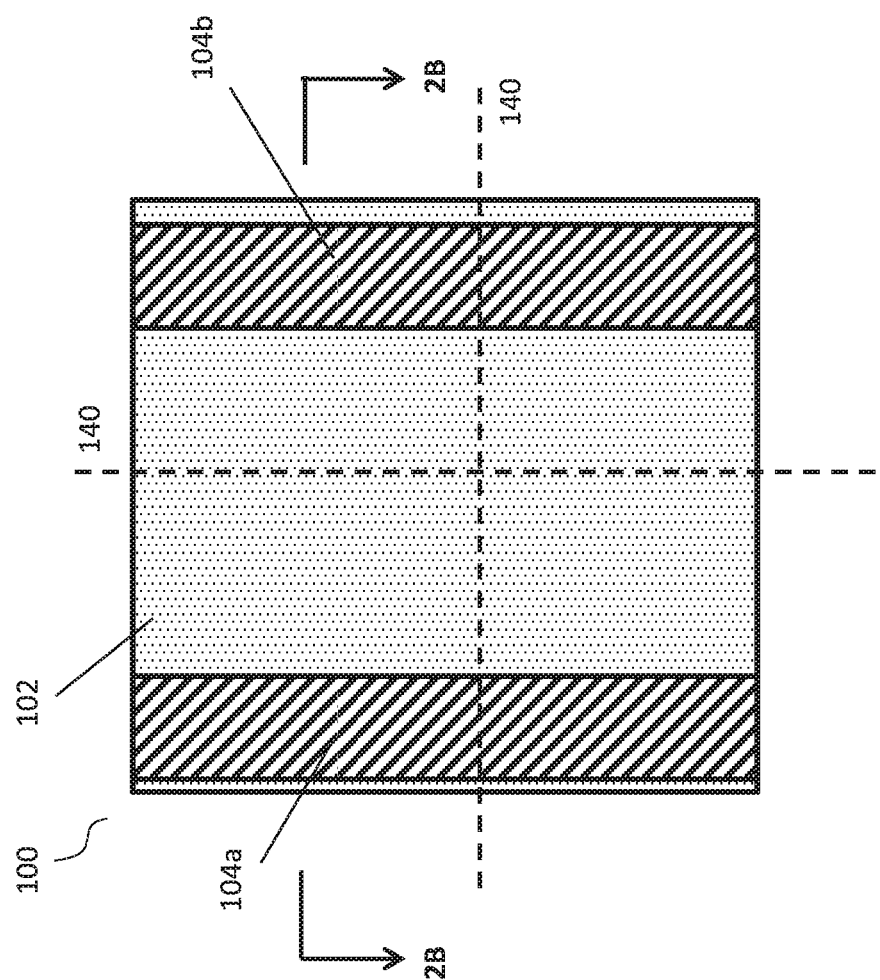
FIGS. 2A and 2B illustrate a top view and a cross-sectional view, respectively, of a semiconductor wafer during various stages of assembly/fabrication in accordance with some embodiments.
Figure 2B:
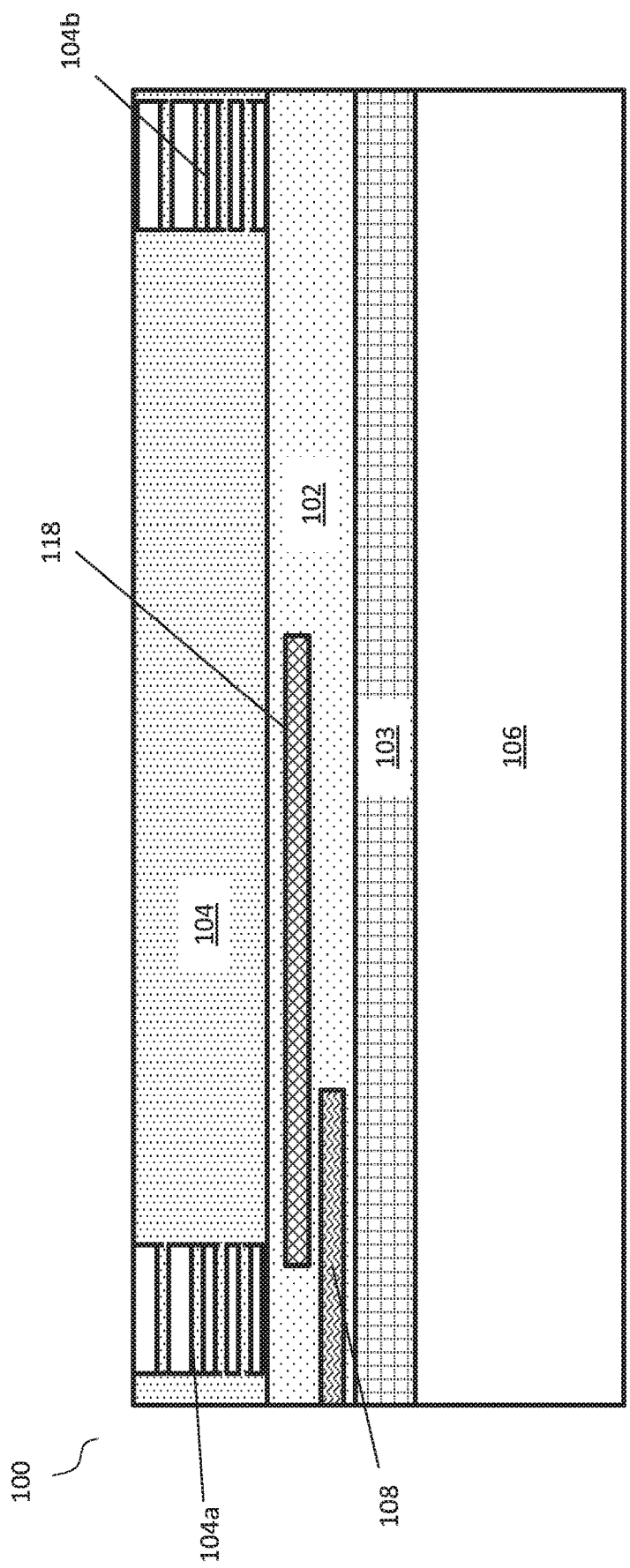

FIG. 2A illustrates a top view of a first semiconductor photonics wafer 100 FIG. 2B is illustrated in a cross-sectional view along line 2B-2B in FIG. 2A.

FIGS. 2A and 2B illustrate the first semiconductor photonics wafer 100 after all front end processing and most back end processing has been completed. Accordingly, the semiconductor substrate 106 may include active devices such as diodes, transistors, and others. In some embodiments, the semiconductor substrate 106 comprises an insulating layer. In one embodiment, the semiconductor substrate 106 is a silicon-on-insulator (SOI) wafer. Alternatively, semiconductor substrate 106 may be a silicon wafer, silicon-on-sapphire (SOS) wafer, III-V semiconductor wafer, silicon carbide (SiC) wafer, or any other type of suitable wafer as may be apparent to one of ordinary skill in the art.

In various embodiments, an optical layer 102 may be formed on top of a buried oxide (BOX) layer 103 disposed on the semiconductor substrate 106. The optical layer 102 may comprise an oxide. In various embodiments, the optical layer 102 may include a plurality of separate layers comprising different components. For example, the optical layer 102 may include various optical devices such as an embedded first waveguide 108 (e.g., a Si waveguide) and an embedded second waveguide 118 (e.g., a SiN waveguide). In various embodiments, optical devices such as the first waveguide 108 and the second waveguide 118 may be fabricated on top of the BOX layer 103. The optical layer 102 may then be formed to cover the optical devices. In some embodiments, the optical layer 102 comprises additional embedded waveguides.

A BEOL (back end of line) layer 104 is formed over the optical layer 102 as illustrated in FIGS. 2A and 2B. The designation back end of line (BEOL) is used to indicate that stage of fabrication of integrated circuits where individual devices (transistors, capacitors, resistors, modulators, photodiodes, multiplexers, demultiplexers, gratings etc.) are interconnected by means of wiring, electrically conductive layers and so on. Consequently, real applications based on the principle discussed above may involve, on top of the optical layer of, e.g., the photonic wafer or chip, a BEOL layer configured for the routing of electrical signal(s) realized with a thickness of, e.g., several microns. Moreover, a seal ring, e.g., a conductive ring configured for electrostatic discharge (ESD) protection, surrounding the chip may be also formed.

The BEOL layer 104 may comprise several metallization layers. The BEOL layer 104 may also include BEOL test structures 104a and 104b formed in it. The BEOL test structures 104a and 104b may be coupled to other devices within the optical layer 102 and/or semiconductor substrate 106. The BEOL test structures 104a and 104b may enable testing of the various devices within the optical layer 102 and/or semiconductor substrate 106. The BEOL test structures 104a and 104b are illustrated in cross-section in FIG. 2B. In some embodiments, the BEOL layer 104 may comprise additional BEOL test structures.

Also shown in FIG. 2A are the scribe lines 140 that separate the individual semiconductor photonic chips of the wafer. A dicing performed along the scribe lines 140 produces separate photonic chips.

Figure 3B:
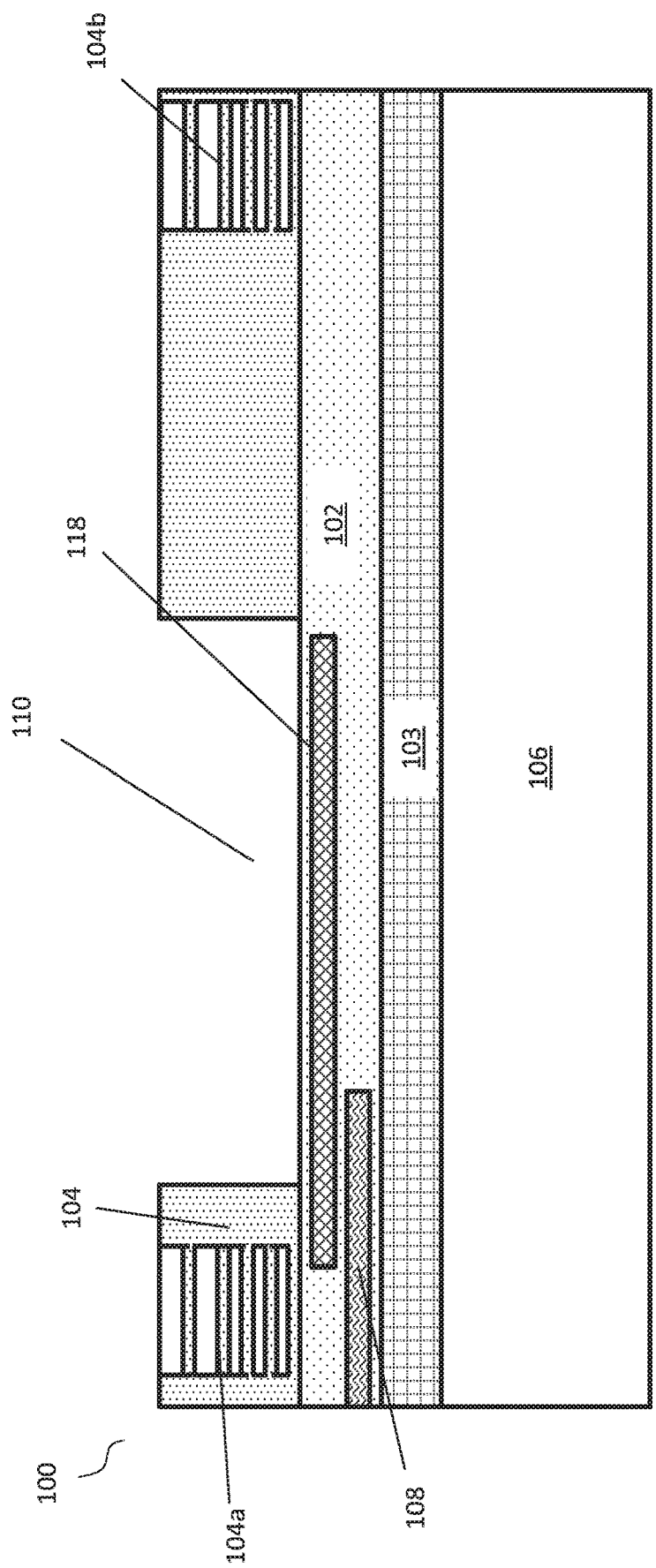

FIG. 3A illustrates a top view of the first semiconductor photonics wafer 100 after forming a first cavity 110 through the BEOL layer 104. FIG. 3B illustrates a cross-sectional view of the first semiconductor photonics wafer 100 with the first cavity 110 illustrated along cross-section 3B-3B shown in FIG. 3A.

Referring next to FIG. 3A, a first cavity 110 is formed in the BEOL layer 104. Step 1001 in FIG. 7 describes the formation of the first cavity in a multi-layer semiconductor photonics wafer. The first cavity 110 is configured to mount the optical interposer, which may provide an optical input/output for the photonic chip.

The first cavity 110 may have a first width W1 of about 1.0 mm to about 3.0 mm and a length perpendicular to the scribe line 140 of about 3.0 mm to about 5.0 mm. The embedded first and second waveguides 108 and 118 may extend beyond sidewalls of the first cavity 110.

The first cavity 110 may be formed using a subtractive process. For example, a subtractive process may include depositing a resist layer followed by a patterning process, which may include an etching process. In one embodiment, the etching process may include a dry etching such as a reactive ion etching process. Alternatively, a wet etching process may be used to form the first cavity 110 in some embodiments.

Figure 4A:
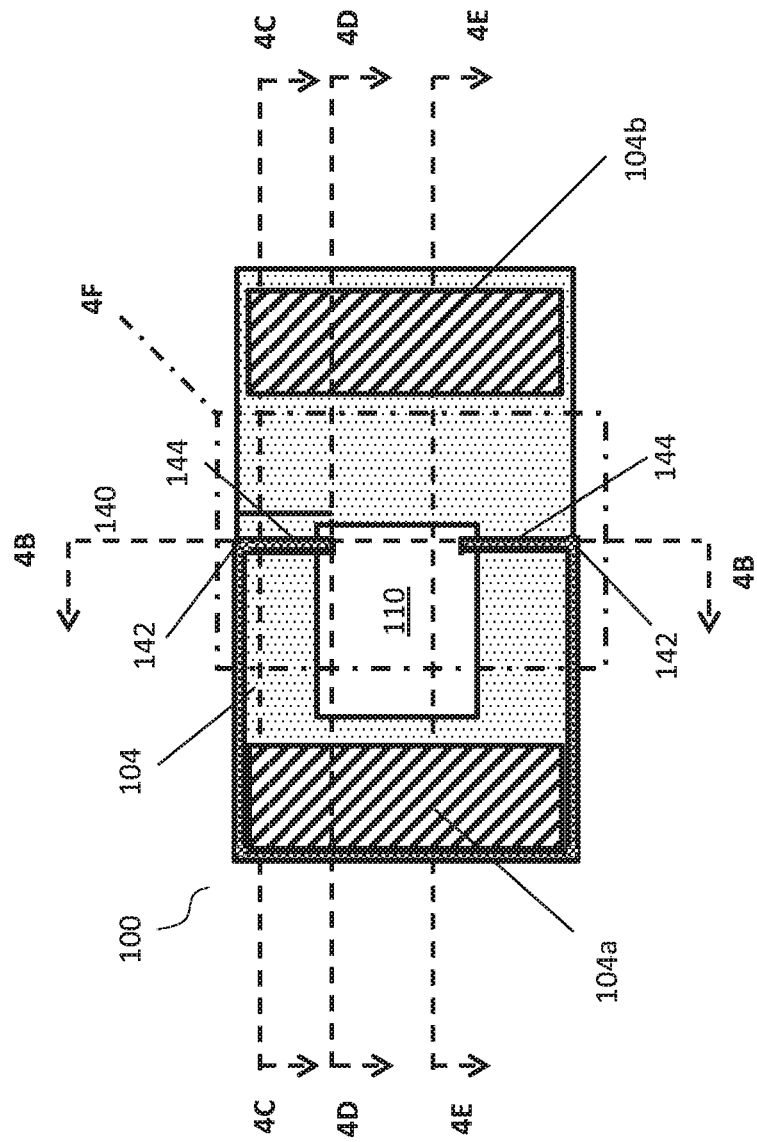
FIGS. 4A through 4F illustrate various top and cross-sectional views of a semiconductor wafer during various stages of assembly/fabrication in accordance with some embodiments.

FIG. 4A next illustrates a top view of the first semiconductor photonics wafer 100 after forming a plurality of grooves 142 along the scribe line 140 and around the perimeter of the first semiconductor photonics wafer 100 on one side of the scribe line 140. In some embodiments, the plurality of grooves 142 may be formed around the entire perimeter of the first semiconductor photonics wafer 100 (not illustrated). Unlike a conventional process in which a continuous groove is formed with a laser ablation process, in various embodiments, a plurality of discontinuous grooves is formed along the scribe line 140.

Step 1003 in FIG. 7 describes forming a plurality of grooves 142 along the scribe line 140 on the surface of the multi-layer semiconductor photonics wafer by activating and deactivating a laser while sweeping it across the multi-layer semiconductor photonics wafer.

As illustrated in FIG. 4A, the plurality of grooves 142 may be formed by a laser cutting process that cuts while repetitively turning the laser (e.g., a short pulse laser) ON and OFF at a predetermined cycle during laser processing. The cycle for the laser may be determined depending on the first width W1 of the cavity as well as the distance between adjacent cavities on an adjacent photonic chip of the wafer along with a scan rate.

An example laser cut process may be a "Hasen Cut." In an embodiment, a laser beam is scanned over the scribe line 140. The laser beam is turned ON while passing directly over on one side of the first cavity 110. The laser is then deactivated (turning OFF the laser beam) while passing directly over the first cavity 110 and reactivated while passing directly over. Thus, the material of BEOL layer 104 on either side of the first cavity 110 is ablated.

The laser may be a short pulse UV type of laser operated at a frequency of about 50 KHz to about 250 KHz, a power of about 1 W to about 5 W, and a scan velocity of about 50 mm/s to about 250 mm/s. In other embodiments, other laser conditions may be set. For example, in one embodiment, the laser is operated at frequencies between 60 KHz and 200 KHz, at powers between 1.5 W and 3.5 W, and at scan velocities between 100 mm/s and 200 mm/s.

The residual material 144 is illustrated in FIG. 4A adjacent to the plurality of grooves 142. The residual material 144 is produced during the formation of the plurality of grooves 142 by laser ablation and is present on the surface of the first semiconductor photonics wafer 100 adjacent to the plurality of grooves 142. The residual material 144 may comprise the material that was laser ablated, for example, may comprise silicon, oxide, nitride, and metals from the metallization layers such as copper, tungsten, titanium, nickel, and others. In some embodiments in which the BEOL layer 104 has a thickness of about 8 microns, the residual material 142 may have a height from about 1 micron to about 6 microns above the surface of the first semiconductor photonics wafer 100, or 1 micron to 6 micron in one embodiment.

Figure 4B:
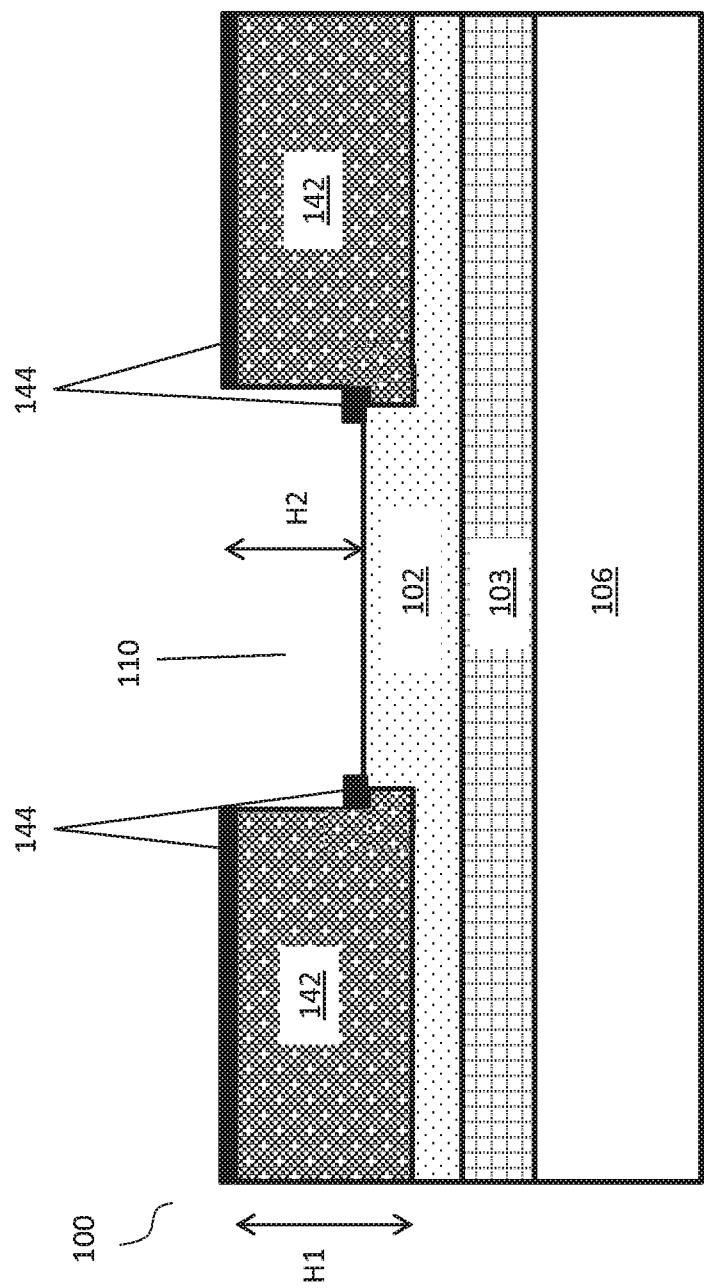

FIG. 4B illustrates a cross-sectional view illustrated along cross-section 4B-4B in FIG. 4A of the first semiconductor photonics wafer 100 after forming the plurality of grooves 142. Sidewalls of the plurality of grooves 142 are located on either side of the first cavity 110, above the optical layer 102 and the semiconductor substrate 106. Cross-section 4B-4B is located along sidewalls of the plurality of grooves 142. The sidewalls of the plurality of grooves 142 may be composed of material from the BEOL layer 104 ablated by the laser during the laser cutting process.

As illustrated in FIG. 4B, the sidewalls of the plurality of grooves 142 may have a height H1. Portions of the residual material 144 are illustrated on the bottom surface of the first cavity 110 and on the top surface of the first semiconductor photonics wafer 100 adjacent to the sidewalls of the plurality of grooves 142. The laser grooving enters a small portion of the cavity 110 in some embodiments, as illustrated in FIG. 4B.

In various embodiments, the first cavity 110 may have a height H2. A ratio between height H1 and height H2 may be about 1:1. Alternatively, the ratio between height H1 and height H2 may be about [1:1] to [1:0.5].

Figure 4C:
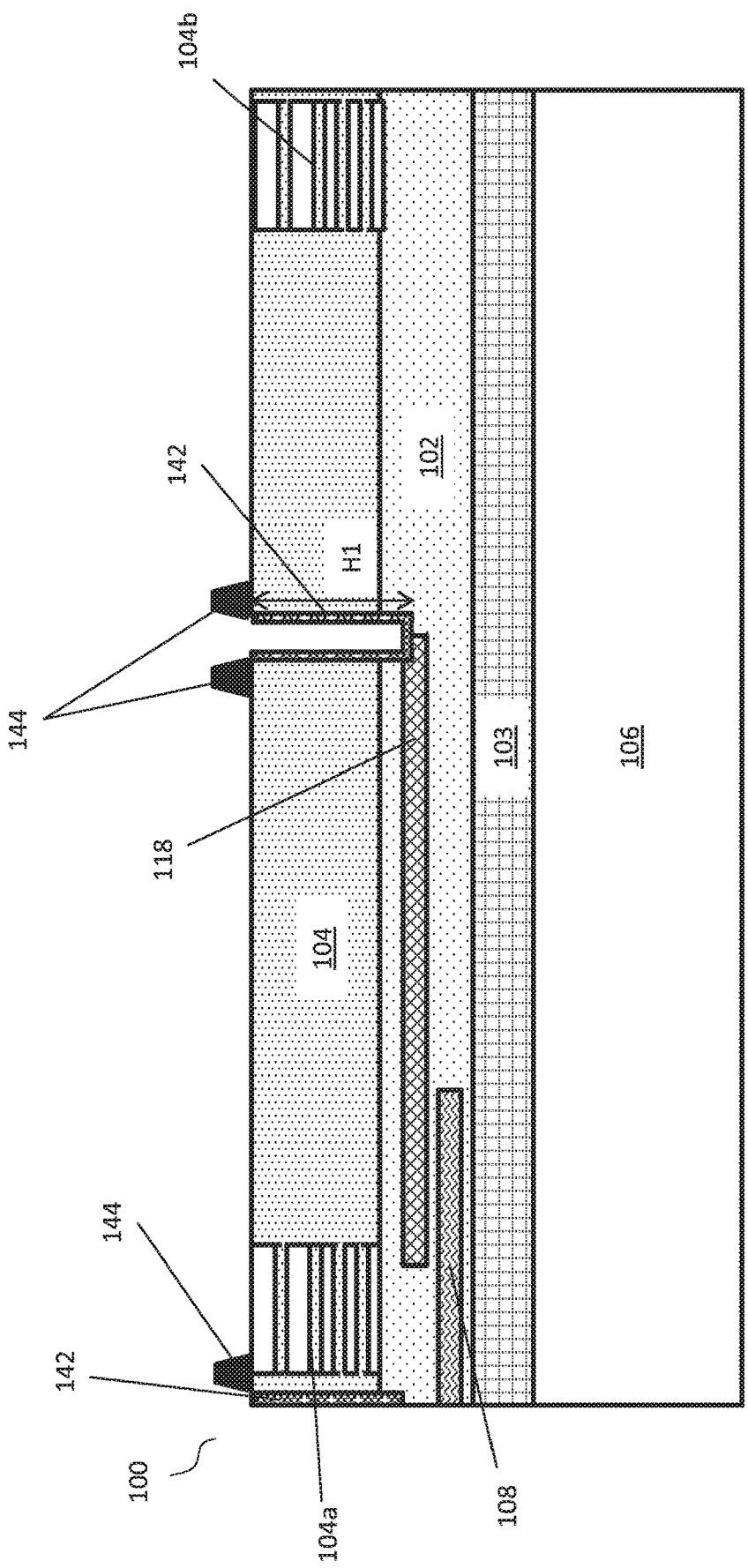

FIG. 4C illustrates a cross-sectional view along cross-section 4C-4C in FIG. 4A of the first semiconductor photonics wafer 100 after forming the plurality of grooves 142. The cross-section 4C-4C does not intersect the first cavity 110 and illustrates the plurality of grooves 142 formed through the BEOL layer 104 and the residual material 144 left by the ablation process adjacent to the plurality of grooves 142.

Figure 4D:
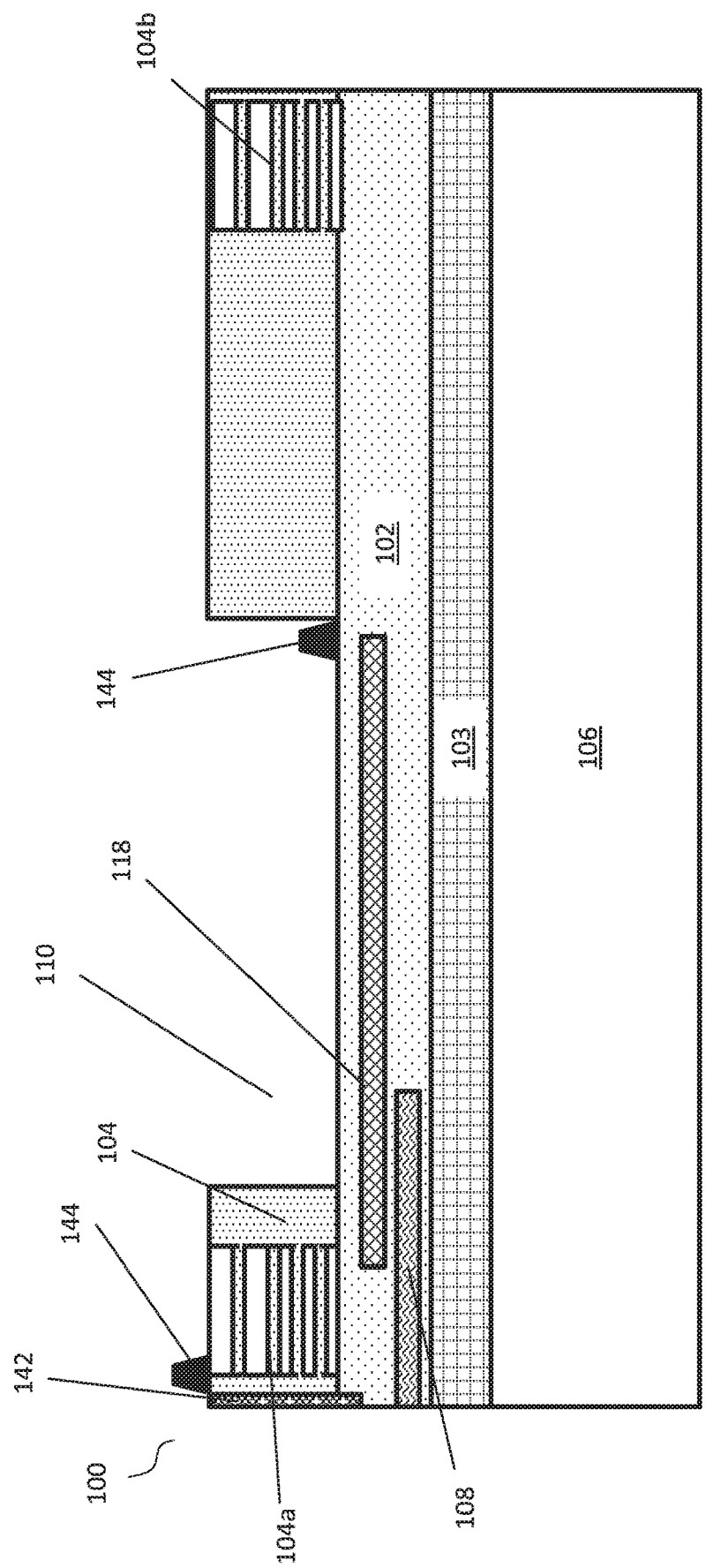

FIG. 4D illustrates another cross-sectional view along cross-section 4D-4D in FIG. 4A of the first semiconductor photonics wafer 100 after forming the plurality of grooves 142. The line 4D-4D in FIG. 4A intersects the first cavity 110 adjacent to an endpoint of one of the plurality of grooves 142. Residual material 144 left from the laser cutting process on the bottom surface of the first cavity 110 is present on line 4D-4D of FIG. 4A. Because cross-section 4D-4D is near to the edge of the first cavity 110, the residual material 144 will not impede the coupling of the optical interposer 150 to the bottom surface of the first cavity 110.

Figure 4E:
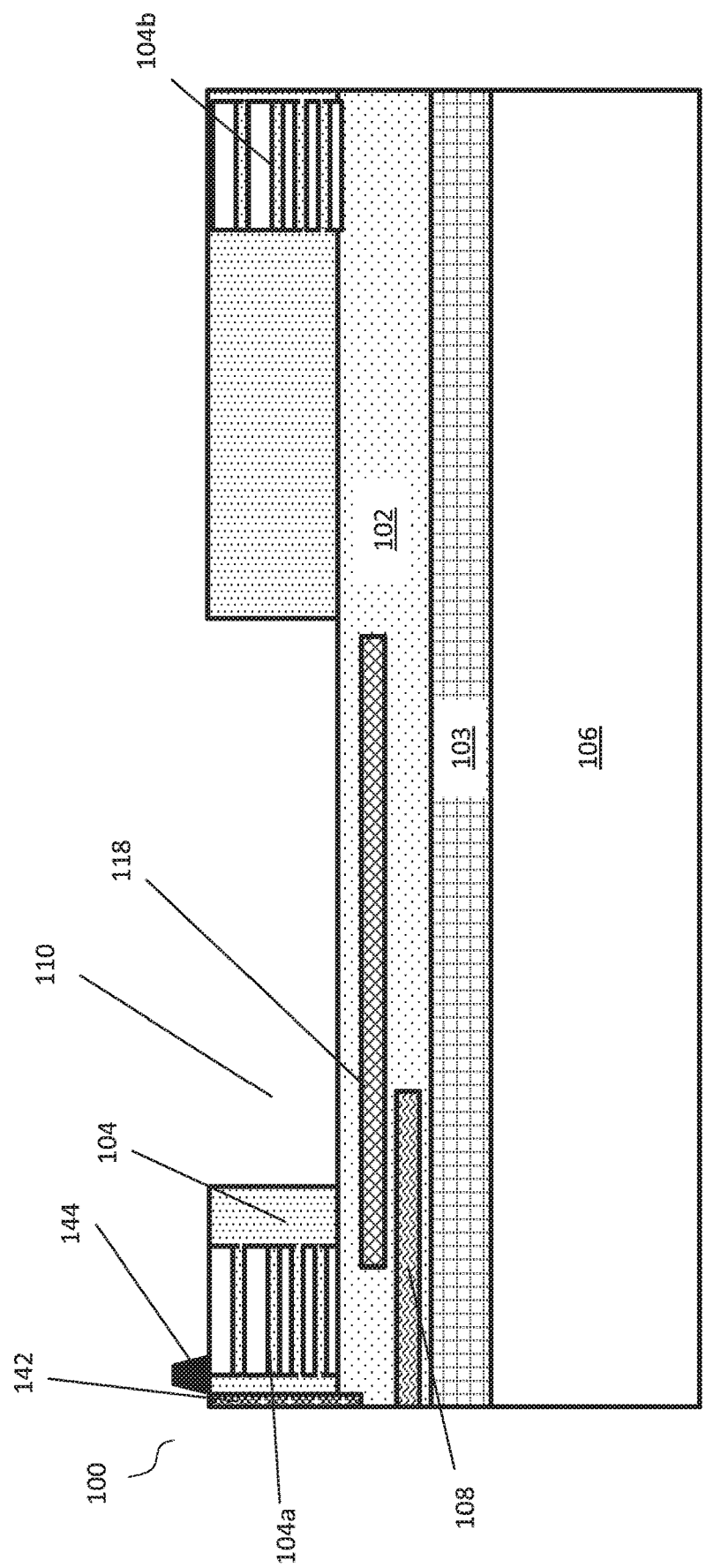

FIG. 4E illustrates yet another cross-sectional view along cross-section 4E-4E in FIG. 4A of the first semiconductor photonics wafer 100 after forming the plurality of grooves 142. Cross-section 4E-4E passes through a region of the first cavity 110 in which no residual material 144 is present due to the plurality of grooves 142 not being cut through a central region of the first cavity 110.

Figure 4F:
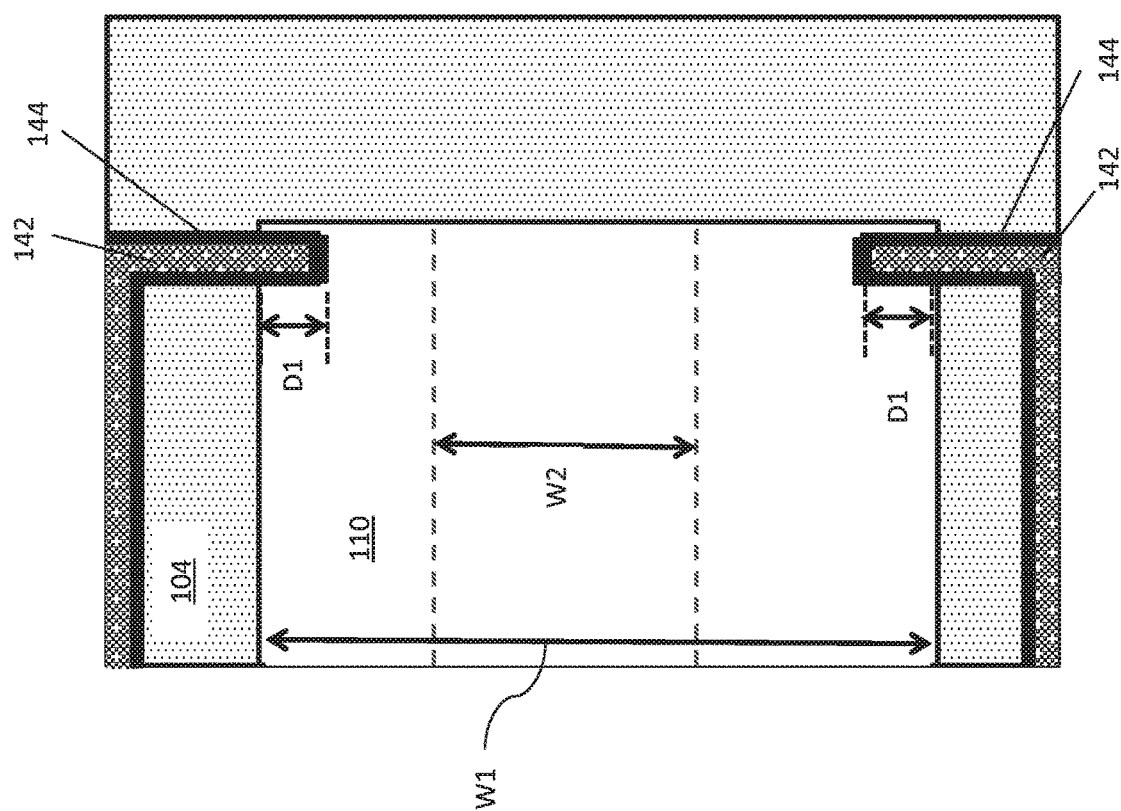

FIG. 4F illustrates a detailed top view of a region 4F illustrated in FIG. 4A. The plurality of grooves 142 may extend a length (groove extension distance D1) into the first cavity 110. In an embodiment, the groove extension distance D1 is small enough so that the optical interposer 150 may fit between the portions of residual material 144 on either side of the first cavity 110. If the groove extension distance D1 is negative, then there may be a significant risk of delamination and/or chipping of the BEOL layer 104. On the other hand, if the groove extension distance D1 is large, it may prevent the optical interposer to be mounted properly into the cavity. Therefore, in various embodiments, the groove extension distance D1 is made to be slightly positive so that the plurality of grooves 142 always extends a little into the cavity but without extending so far that it interferes with the mounting of the interposer. A small positive groove extension distance D1 ensures that any misalignment errors do not result in delamination and/or chipping issues and cause a reduction in process yield The cavity width W1 may vary because of other factors such as the number of waveguides and may not be related directly to the groove extension distance D1. However, for a particular implementation in one embodiment, the groove extension distance D1 is about 0.1% to about 5% of the first width W1 of the first cavity 110, and about 1% of the first width W1 in one embodiment. In one or more embodiments, the groove extension distance D1 is a positive number that is less than 10% of the first width W1.

The ratio of the groove extension distance D1 to a difference between the first width W1 of the first cavity 110 and a second width W2 of the optical interposer 150 may be between about [1:8] to about [1:15]. For example, in one embodiment, the difference between the first width W1 and the second width W2 is 200 microns, and the groove extension distance D1 is between about 20 microns and 25 microns.

FIG. 5A illustrates a top view after dicing the wafer to form a first semiconductor photonics chip 100a. As shown by FIG. 5A, the first semiconductor photonics wafer 100 has been cut by a dicing saw along the scribe line 140.

At this stage of processing, the dicing saw has cut along the left and right portions of the plurality of grooves 142 and through the portion of the first cavity 110 along the scribe line 140 between the left and right portions of the plurality of grooves 142. Because the BEOL layer 104 along the scribe line 140 has been ablated by the laser, delamination and cracking of the BEOL layer 104 may be avoided.

Figure 5B:
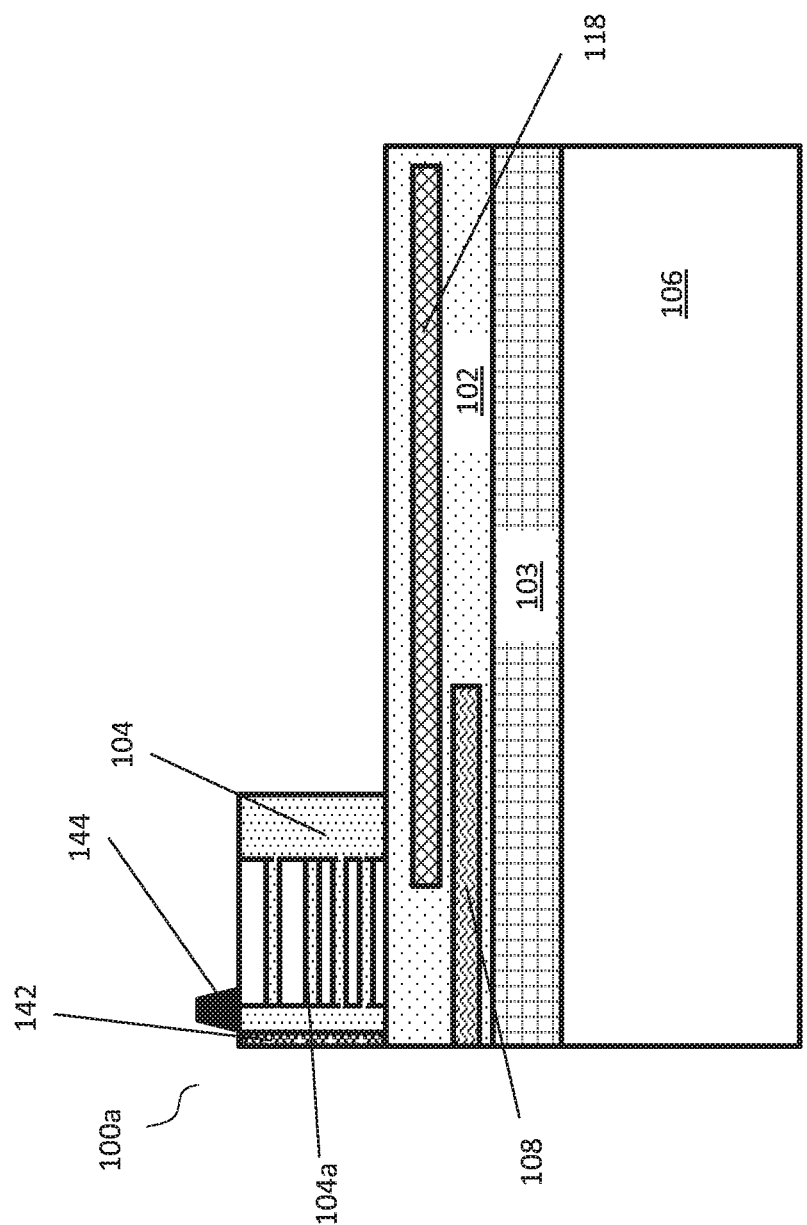
FIG. 5B illustrates a cross-sectional view of a semiconductor chip during various stages of assembly/fabrication in accordance with some embodiments.

Step 1005 in FIG. 7 describes dicing the multi-layer semiconductor photonics wafer along the line of the plurality of grooves using a dicing blade. As illustrated by FIGS. 5A-C, the first semiconductor photonics wafer 100 is cut by a dicing saw along the scribe lines 140. Because the surface layer of the first semiconductor photonics wafer 100 along the scribe line 140 has been ablated by the laser, delamination and cracking of the surface layer of the first semiconductor photonics wafer 100 may be avoided.

FIG. 5B illustrates a cross-sectional view of the first semiconductor photonics chip bow after dicing the first semiconductor photonics wafer 100, illustrated along cross-section 5B-5B shown in FIG. 5A. As shown in FIG. 5A, cross-section 5B-5B passes through the center of the first cavity 110. No residual material 144 is present in this cross-section of the boundary of the first cavity 110 due to the plurality of grooves 142 not being cut through a central region of the first cavity 110. This is unlike the conventional process in which a groove is cut across the entire cavity, leading to residual material 144 being present on the bottom surface of the cavity and impeding the coupling with the optical interposer 150 as illustrated in FIG. 1B.

Figure 6A:
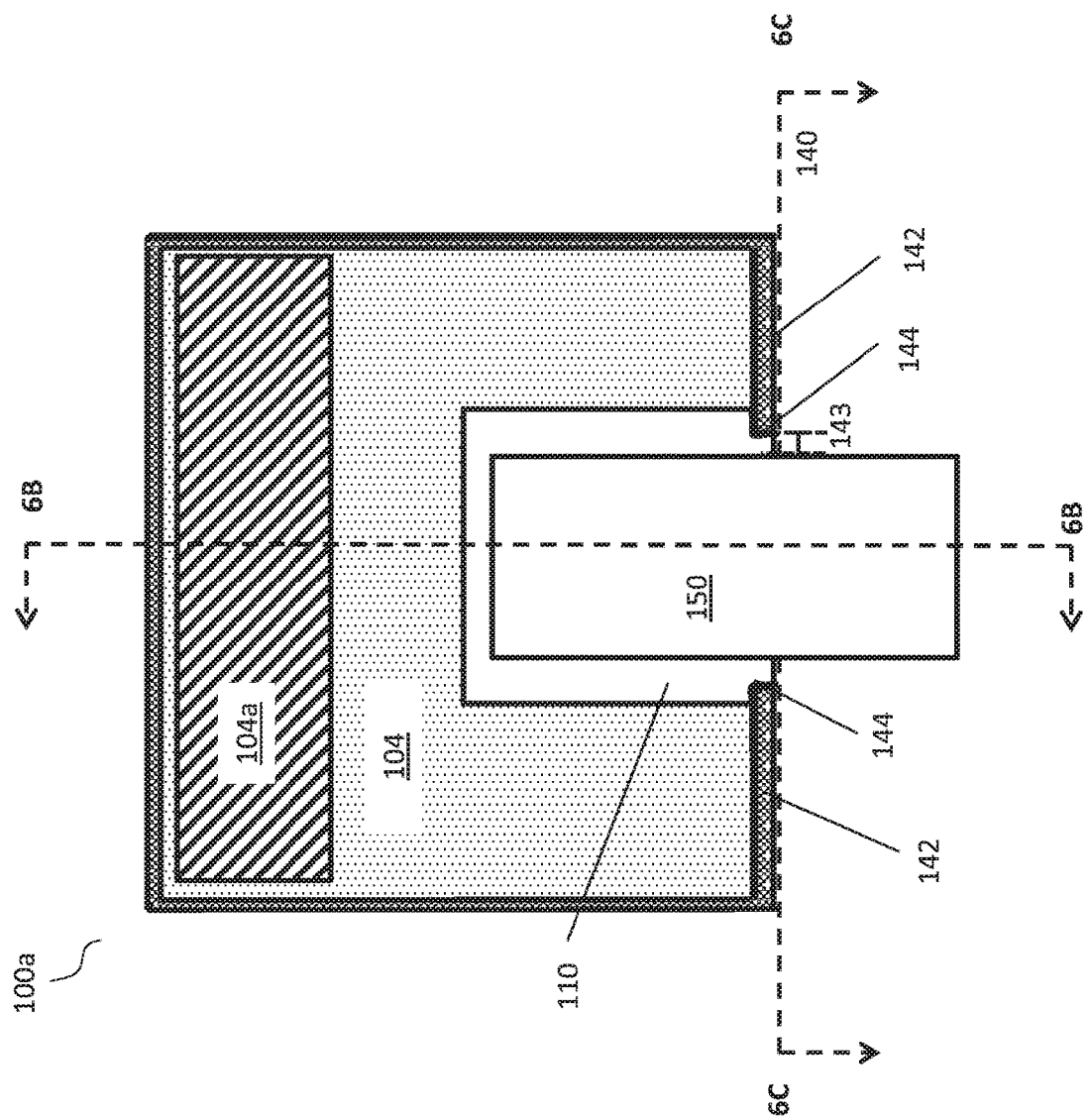
FIGS. 6A, 6B, and 6C illustrate a top view and different cross-sectional views of an apparatus comprising a semiconductor chip during various stages of assembly/fabrication coupled with an optical interposer in accordance with some embodiments.
Figure 6B:
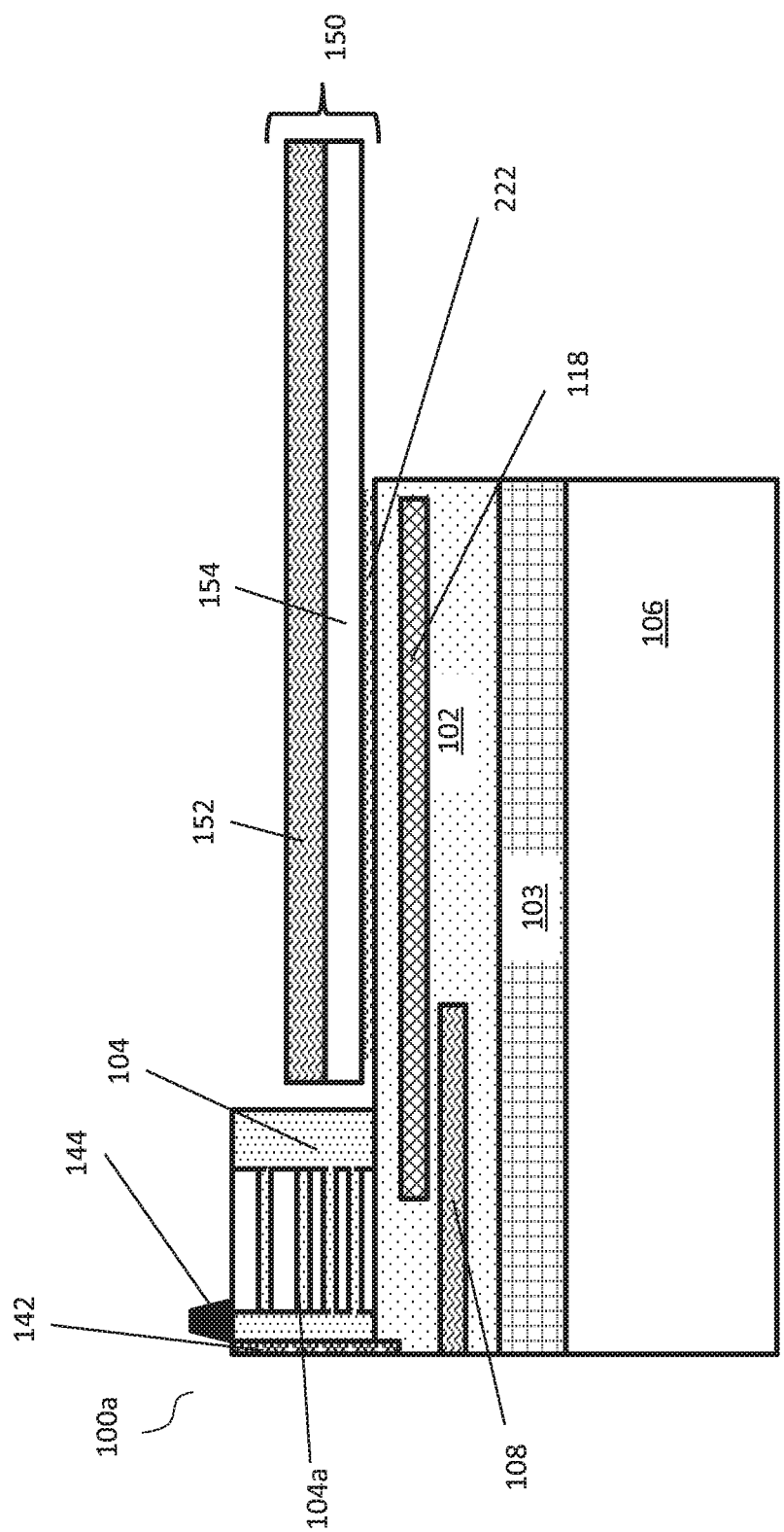
Figure 6C:
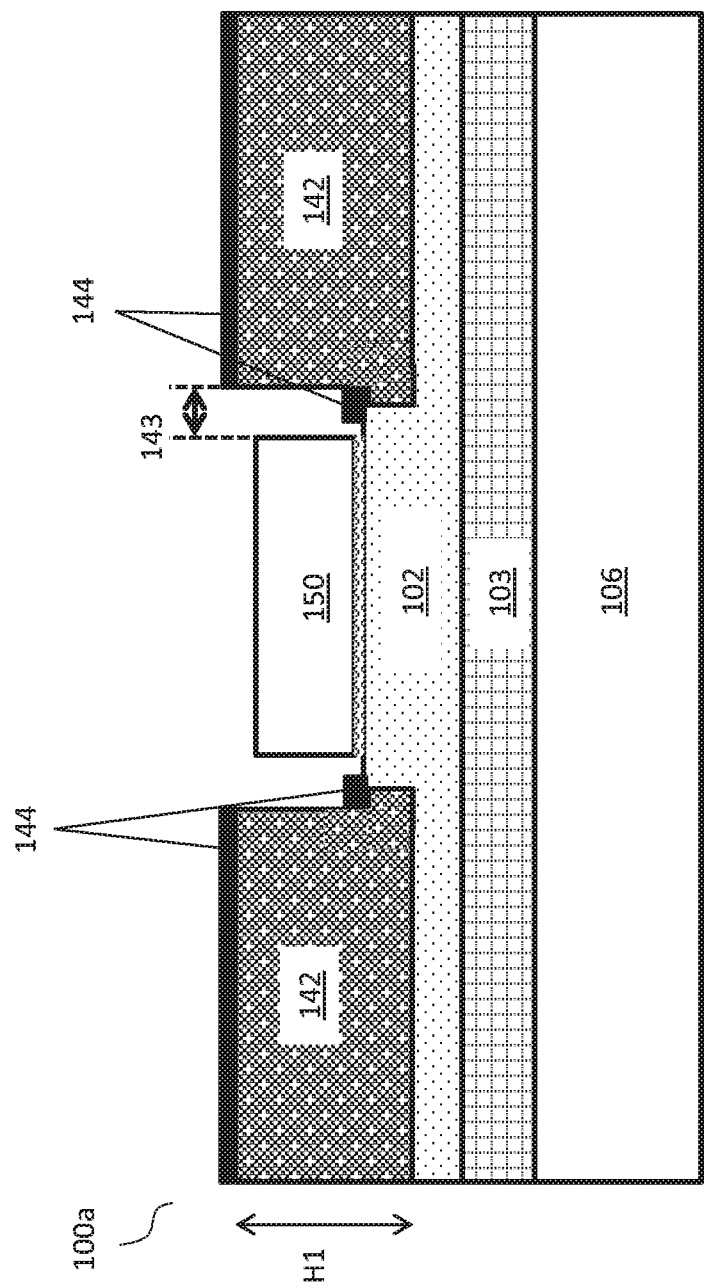
Figure 7:
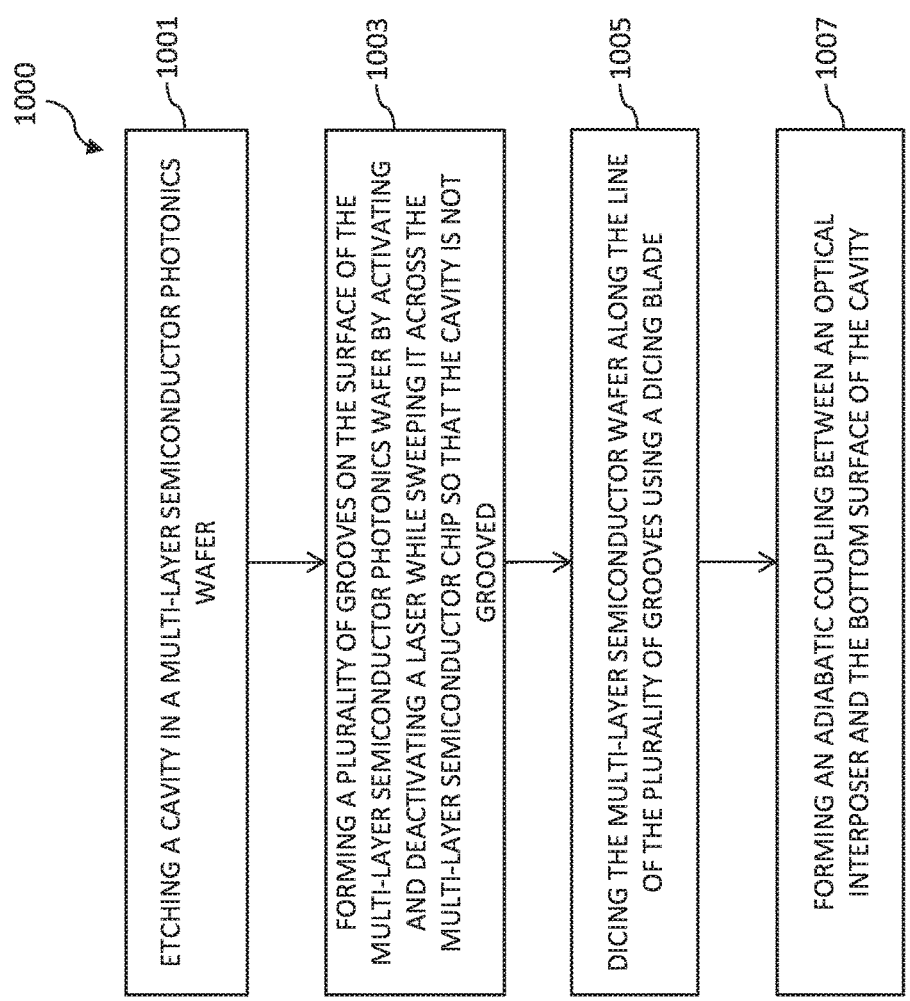
FIG. 7 is a flow diagram illustrating a method of forming an apparatus comprising a semiconductor chip coupled with an optical interposer in accordance with some embodiments.

FIG. 6A illustrates a top view of the first semiconductor photonics chip 100a after being coupled to the optical interposer 150 to form a photonic device. FIGS. 6B and 6C, illustrate cross-section views of lines 6B-6B and 6C-6C of FIG. 6A respectively. Step 1007 in FIG. 7 describes forming an adiabatic coupling between an optical interposer and the bottom surface of the cavity.

Referring to FIG. 6B, the optical interposer 150 may comprise a waveguide core 154 covered by a waveguide cladding 152. The waveguide core 154 may comprise glass. The optical interposer 150 may be adiabatically coupled to a bottom surface of the first cavity 110 by an adhesive material 222. After mounting the optical interposer 150 on the bottom surface of the first cavity no, the adhesive material 222 may be cured by an appropriate curing process.

As illustrated in FIG. 6C, the optical interposer 150 is disposed on the bottom surface of the first cavity 110 so that there is a clearance 143 between the optical interposer 150 and the edges of the first cavity 110. In this way, the optical interposer 150 may be coupled to the bottom surface of the cavity 120 without overlaying portions of the residual material 144 from the laser ablation of the plurality of grooves 142. By avoiding the overlaying of portions of the residual material 144, the optical interposer 150 may be coupled to the first semiconductor photonics chip 100a without a tilt induced by the optical interposer resting on the portions of residual material 144.

Figure 12:
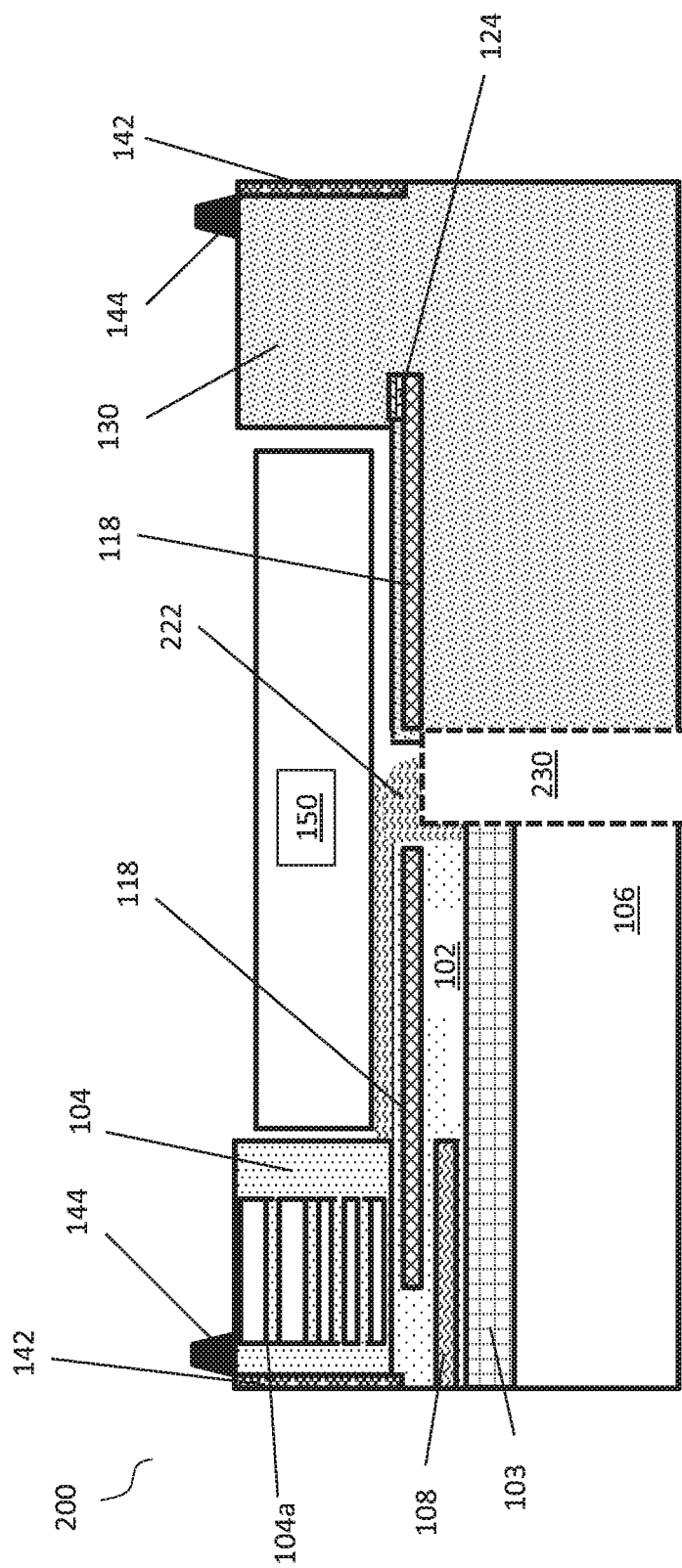
Figure 13:
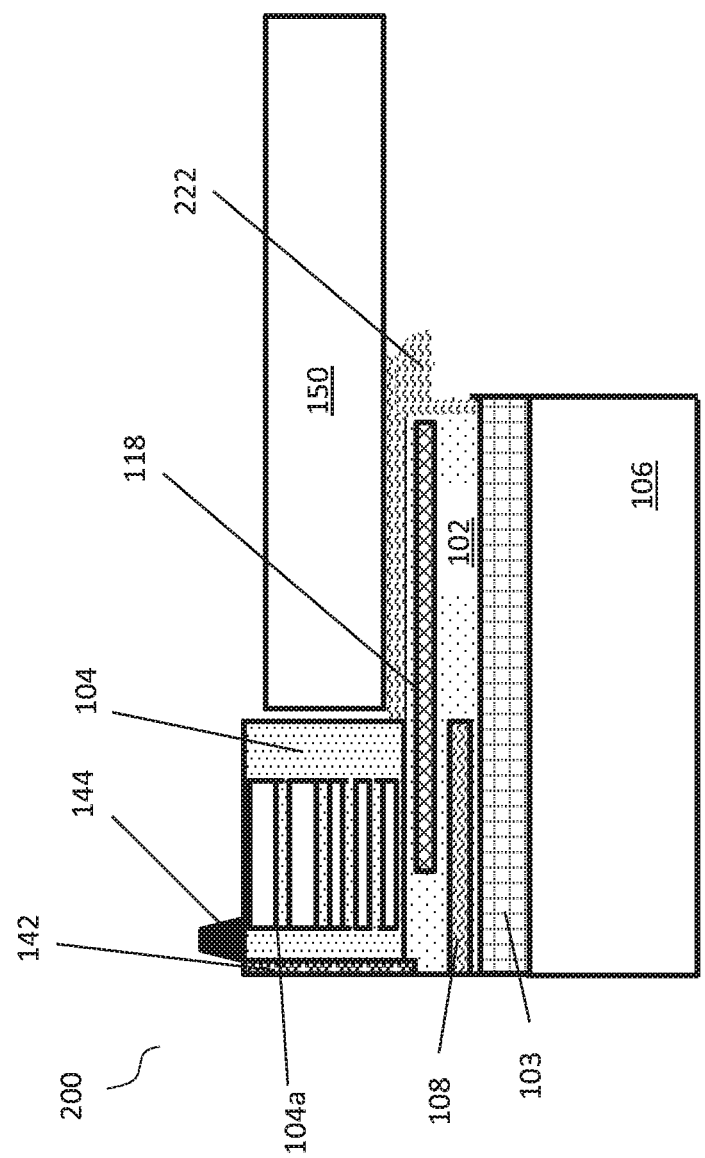
FIG. 13 illustrates a cross-sectional view of a semiconductor chip during various stages of assembly/fabrication in accordance with some embodiments.
Figure 14:
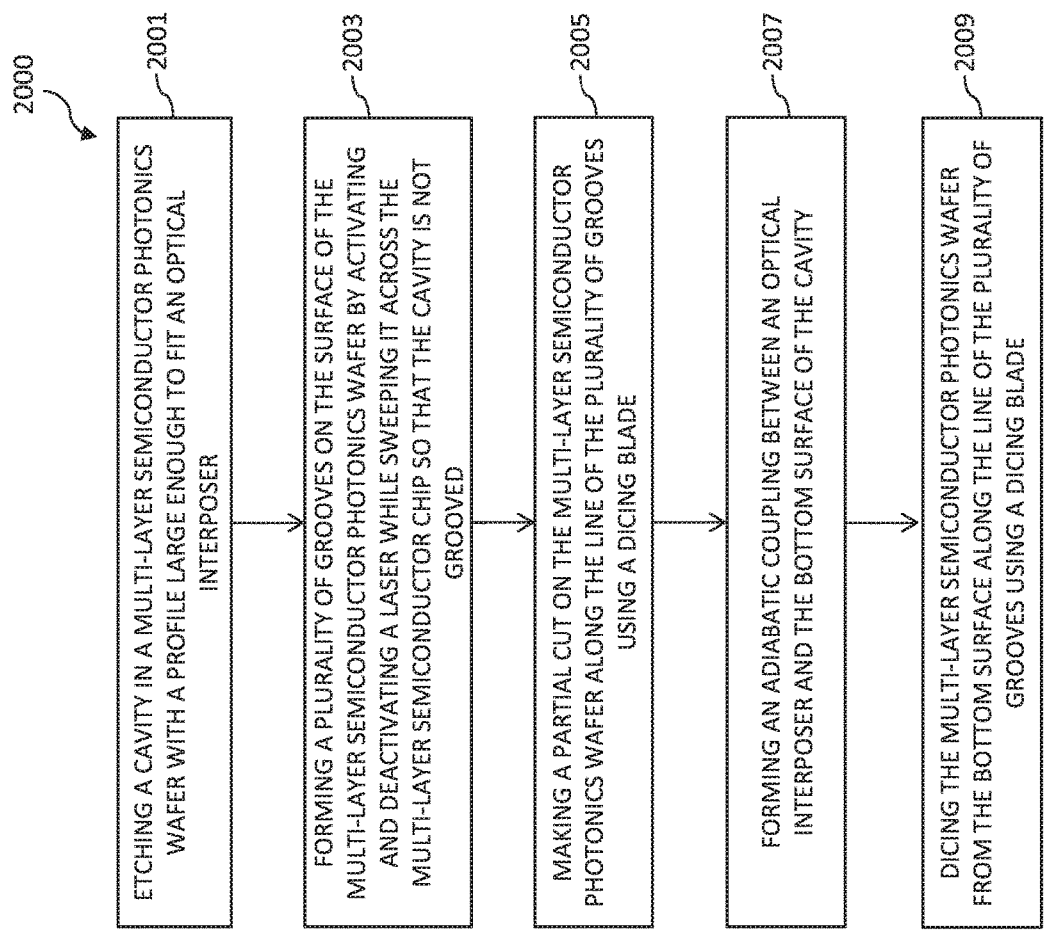
FIG. 14 is a flow diagram illustrating another method of forming an apparatus comprising a semiconductor chip coupled with an optical interposer in accordance with some embodiments.

FIGS. 8-14 illustrate a photonic device during various stages of fabrication in accordance with a second method embodiment of the invention, which differs from the embodiment illustrated in FIGS. 2-7 in the sizes of the cavities for the optical interposer and in the order of the dicing and coupling method steps. FIG. 14 illustrates another method 2000 of fabricating an optical apparatus as depicted above in FIGS. 8-13, in accordance with an embodiment of the invention.

In an alternate method embodiment of assembly described by FIGS. 8-14, the optical interposer is coupled to the bottom surface of the cavity after forming the plurality of grooves and before performing the blade dicing.

Figure 8:
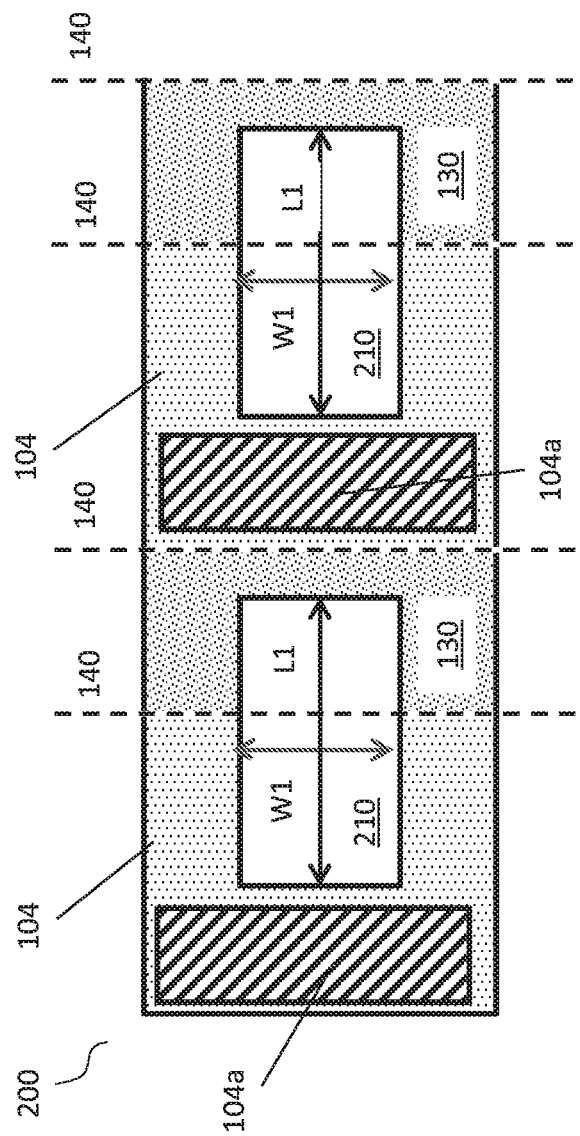
FIGS. 8 and 9 illustrate a top view of a semiconductor wafer during various stages of assembly/fabrication in accordance with some embodiments.

FIG. 8 illustrates a top view and a cross-sectional view of a second semiconductor photonics wafer 200. FIG. 8 displays a portion of the second semiconductor photonics wafer 200 that may be diced to form two semiconductor photonics chips.

Step 2001 in FIG. 14 describes etching a cavity in a multi-layer semiconductor photonics wafer with a profile with dimensions of sufficient size to fit an optical interposer. As illustrated in FIG. 8, a second cavity 210 is formed in the surface of the second semiconductor photonics wafer 200 through the BEOL layer 104.

The second semiconductor photonics wafer 200 may comprise similar features to the first semiconductor photonics wafer 100 illustrated above in FIGS. 2A and 2B. The second semiconductor photonics wafer 200 may also comprise sacrificial test areas 130 between scribe lines 140. The sacrificial test areas 130 may contain optical grating structures 124, as illustrated below in FIG. 10. As discussed in prior embodiments, the sacrificial test areas 130 will be discarded during further processing after attaching the interposer and dicing. A second cavity 210 is formed in the surface of the second semiconductor photonics wafer 200 through the BEOL layer 104 and the sacrificial test area 130. In some embodiments, the second cavity 210 may be formed with an etching process similar to the process used to form the first cavity 110 above. The second cavity 210 is formed to be of sufficient size so that the entire bottom surface of the optical interposer 150 may rest in the second cavity 210. The second cavity 210 may have a width similar to the width W1 of the first cavity 110, and a length L1 perpendicular to the scribe line 140 in order to accommodate the full length of the optical interposer 150.

Figure 9:
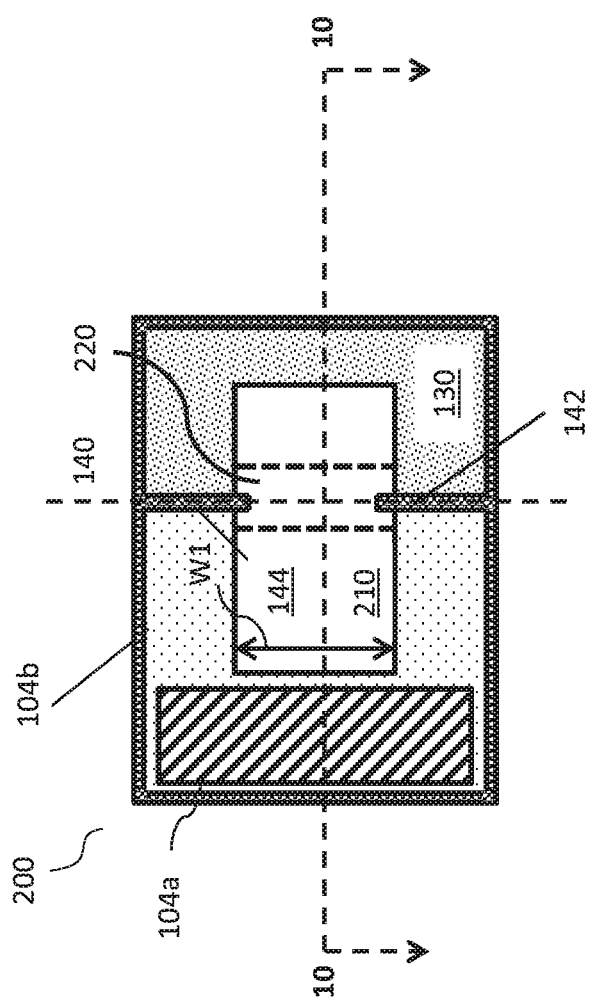

FIG. 9 illustrates in a top view a plurality of grooves 142 formed along the scribe line 140 of the second semiconductor photonics wafer 200 and around the perimeter of the second semiconductor photonics wafer 200 on one side of the scribe line 140. In some embodiments, the plurality of grooves 142 may be formed around the entire perimeter of the second semiconductor photonics wafer 200, as illustrated in FIG. 9.

As next described using Step 2003 of FIG. 14, a plurality of grooves is formed on the surface of the multi-layer semiconductor photonics wafer along the scribe line 140. As described above for FIG. 4, the plurality of grooves 142 may be formed by a laser cutting process.

In an embodiment, the laser is set to be passed over the scribe line 140. The laser is turned on while passing over and ablating the material of BEOL layer 104 on one side of the second cavity 210, the laser is deactivated while passing over the second cavity 210, and the laser is reactivated while passing over and ablating the material of BEOL layer 104 on the other side of the second cavity 210.

Figure 10:
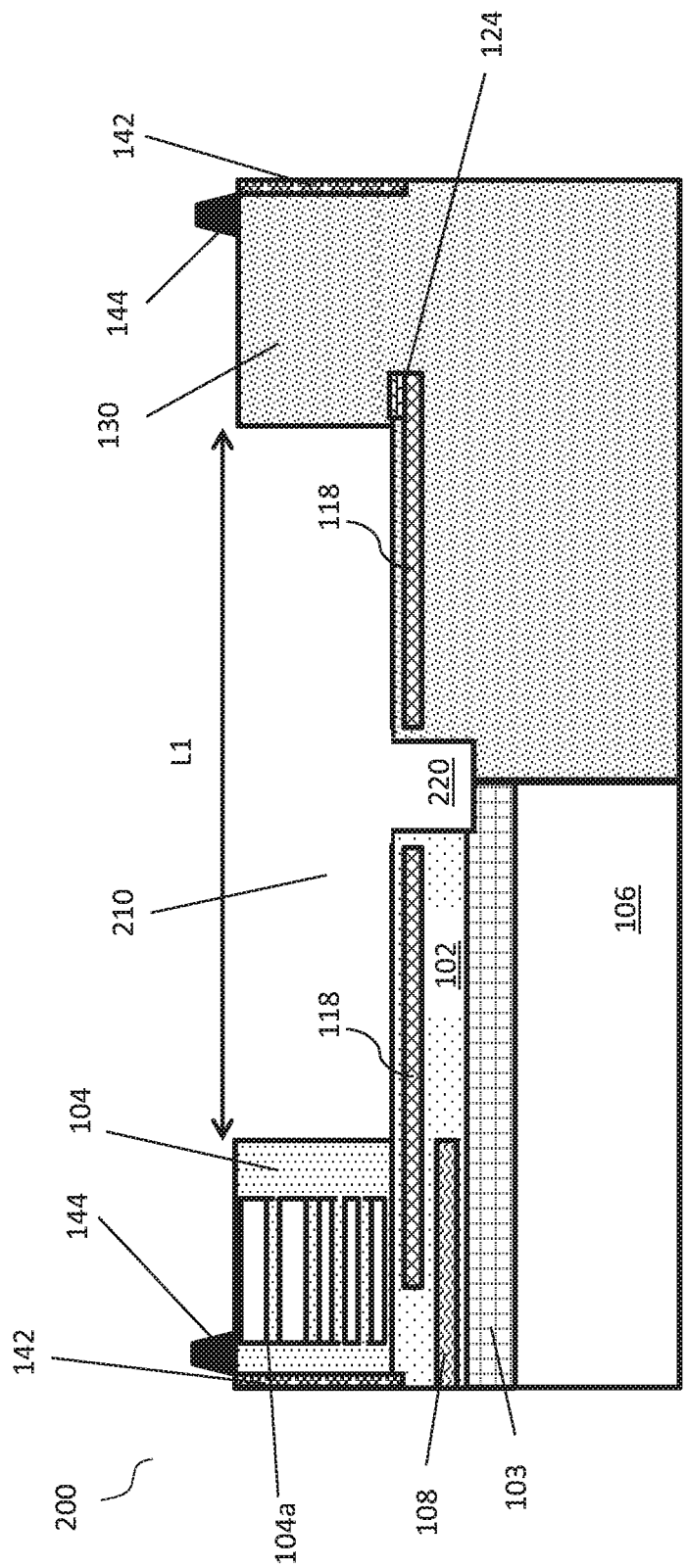
FIGS. 10, 11, and 12 illustrate a cross-sectional view of a semiconductor wafer during various stages of assembly/fabrication in accordance with some embodiments.

FIG. 10 illustrates, in a cross-sectional view along line 10-10 of FIG. 9, a partial cut 220 made on the multi-layer semiconductor photonics wafer using a dicing blade along the scribe line 140 (Step 2005 of FIG. 14). In some embodiments, the BEOL layer 104 may include optical grating structures 124 for optical testing coupled to the second waveguide 118 in the sacrificial test area 130. In various embodiments, the partial cut 220 may extend into the optical layer 102 without completely extending through to the semiconductor substrate 106. In some embodiments, the partial cut 220 extends through the optical layer 102 and into the BOX layer 103. In one or more embodiments, the partial cut 220 extends into the optical layer 102, the BOX layer 103, and the semiconductor substrate 106 to a depth that is between 0.3 to about 0.8 of the combined thickness of the optical layer 102, the BOX layer 103 and the semiconductor substrate 106.

The partial cut 220 is made through the plurality of grooves 142 and through the portion of the second cavity 210 between the portions of the plurality of grooves 142 along the scribe line 140.

Figure 11:
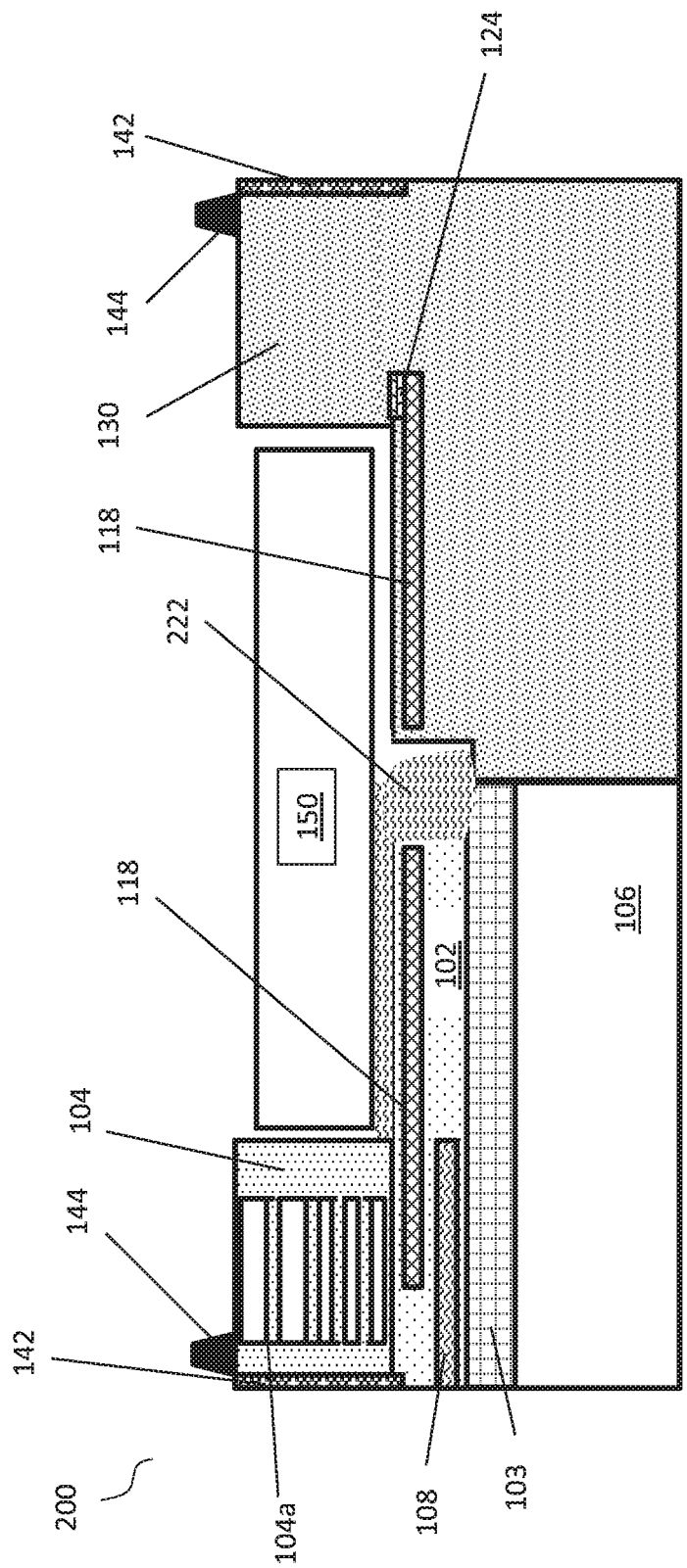

FIG. 11 illustrates in a cross-sectional view of a photonic device after attaching an optical interposer 150. The optical interposer 150 is adiabatically coupled to a bottom surface of the second cavity 210 using an adhesive material 222 (Step 2007 of FIG. 14).

The adhesive material 222 may be an epoxy or other optically transparent adhesive material in one embodiment. In one embodiment, the adhesive material 222 is applied onto the bottom surface of the second cavity 210.

Similar to the prior embodiment, because the plurality of grooves 142 was not made across the middle portion of the second cavity 210, no residual material from the laser ablation is present on the middle portion of the bottom surface of the second cavity 210. This allows the optical interposer 150 to be adiabatically coupled to the bottom surface of the second cavity 210 without a tilt that could impede the efficiency of the optical coupling.

In addition, in this embodiment, the partial cut 220 illustrated above in FIG. 10 may act as a reservoir for any excess adhesive material 222, preventing the adhesive material 222 from accumulating or coagulating unevenly on the bottom surface of the second cavity 210, which would then reduce the tilt of the optical interposer 150 relative to the second semiconductor photonics wafer 200. By acting as a reservoir for the adhesive material 222, the partial cut 220 will prevent capillary forces from allowing the adhesive material 222 to fill the void between a bottom surface of the optical interposer 150 and a top surface of the sacrificial test area 130, which would prevent the later separation of the sacrificial test area 130 from the optical interposer 150.

FIG. 12 illustrates the photonic device after completing the dicing process. FIG. 12 illustrates in a cross-sectional view a bottom cut 230 made from the bottom surface of the second semiconductor photonics wafer 200 along the scribe line 140 directed upwards to meet the partial cut 220 (Step 2009 of FIG. 14).

In an embodiment, a dicing blade is used to make the bottom cut 230. In other embodiments, the bottom cut 230 may be made with another technique such as, e.g., a stealth laser dicing. The bottom cut 230 is made deep enough to separate the second semiconductor photonics wafer 200 but not deep enough to cut into the optical interposer 150. In some embodiments, the bottom cut 230 may be performed in conjunction with other dicing techniques to section a second semiconductor photonics chip 200a from the second semiconductor photonics wafer 200.

FIG. 13 illustrates in a cross-sectional view the removal of the sacrificial test area 130 of the divided second semiconductor photonics wafer 200 after the bottom cut 230 is made. The remaining optical apparatus may comprise similar features to the photonic device illustrated in FIG. 6 above, despite being fabricated by a different method embodiment.

Figure 17:
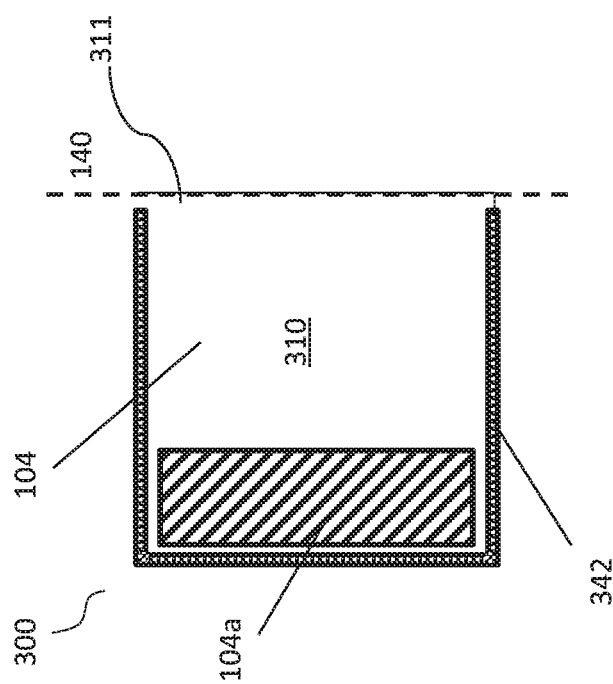
FIGS. 17 and 18 illustrate a top view of a semiconductor chip during various stages of assembly/fabrication in accordance with some embodiments.
Figure 18:
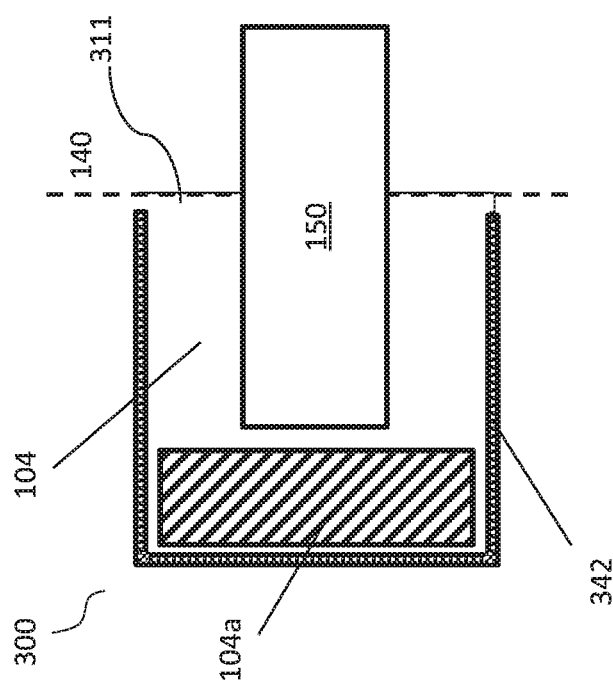
Figure 19:
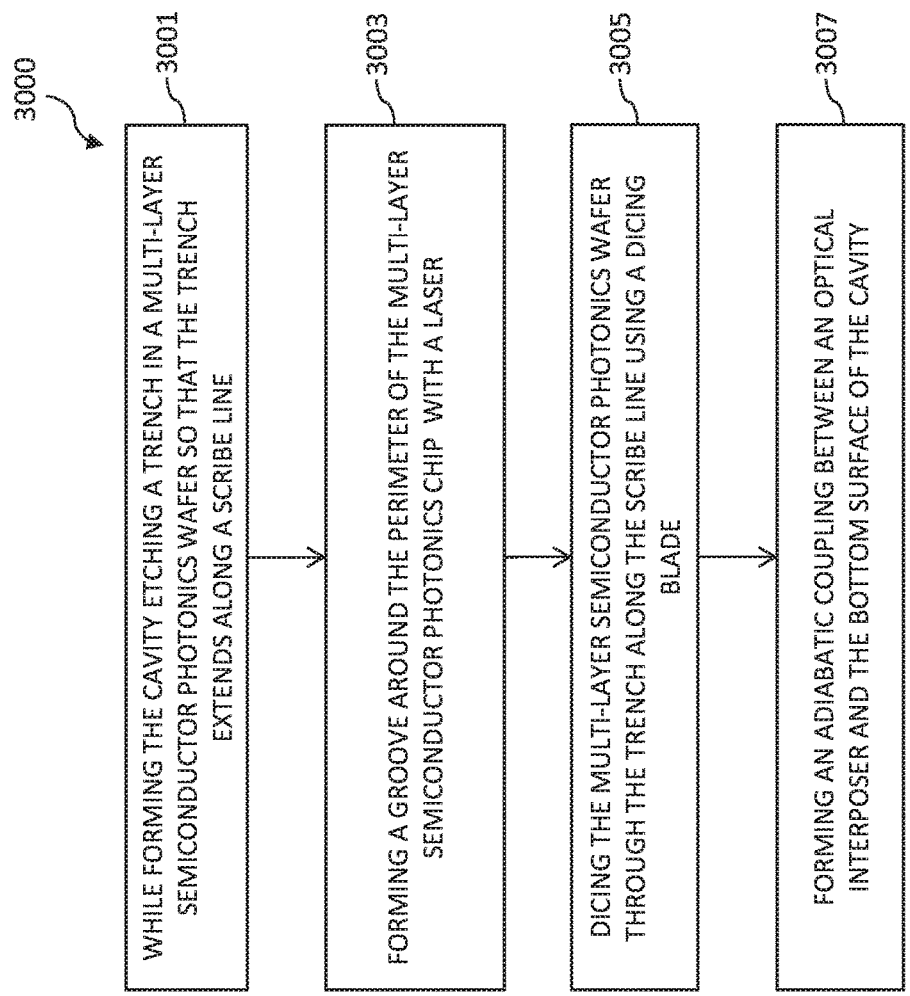
FIG. 19 is a flow diagram illustrating yet another method of forming an apparatus comprising a semiconductor chip coupled with an optical interposer in accordance with some embodiments.

FIGS. 15-19 illustrate a photonic device during various stages of fabrication in accordance with a third method embodiment of the invention, which differs from the embodiments illustrated in FIGS. 2-7 and in FIGS. 8-14 by not requiring an intermittent step laser process. FIG. 19 illustrates yet another method 3000 of fabricating an optical device as depicted above in FIGS. 15-18, in accordance with an embodiment of the invention.

In yet another method embodiment described by FIGS. 15-19, a cavity is etched with portions of the cavity extending along a scribe line and the semiconductor photonics wafer may then be divided by a dicing saw along the scribe line through the extended cavity without risk of cracking of delamination of the BEOL layer.

Figure 15:
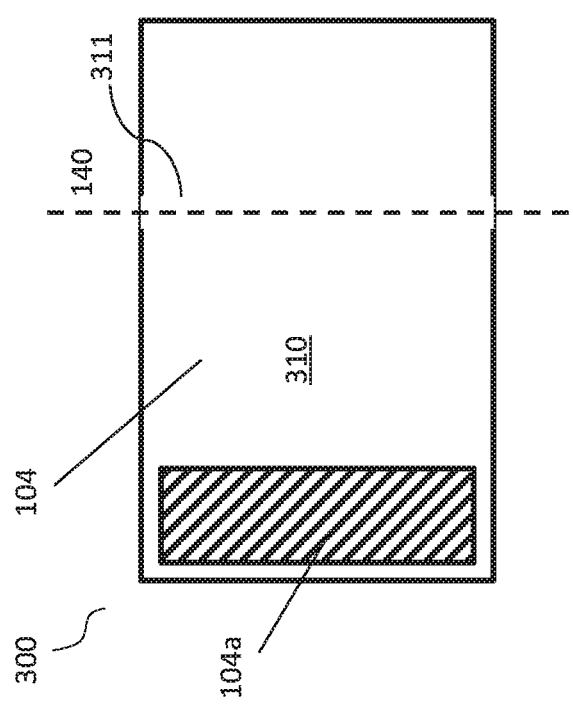
FIGS. 15 and 16 illustrate a top view of a semiconductor wafer during various stages of assembly/fabrication in accordance with some embodiments.

FIG. 15 illustrates a top view of cross-sectional view of a third semiconductor photonics wafer 300. The third semiconductor photonics wafer 300 may comprise similar features to the first semiconductor photonics wafer 100 and the second semiconductor photonics wafer 200 illustrated above in FIGS. 2A-B and in FIG. 9, respectively.

Step 3001 of FIG. 19 describes etching a trench in a multi-layered semiconductor photonics wafer so that the trench extends along a scribe line.

A third cavity 310 and a plurality of trenches 311 are formed in the surface of the third semiconductor photonics wafer 300 through the BEOL layer 104. The plurality of trenches 311 extends along the scribe line 140 to the edges of the third semiconductor photonics wafer 300 (not shown). The third cavity 310 may have dimensions similar to the first cavity 110. The third cavity 310 is connected to two of the plurality of the trenches 311. In this embodiment, the metallization is avoided from the scribe region in which the plurality of trenches 311 is formed.

In some embodiments, the third cavity 310 may be formed with an etching process similar to the process used to form the first cavity 110 and the second cavity 210 above.

Figure 16:
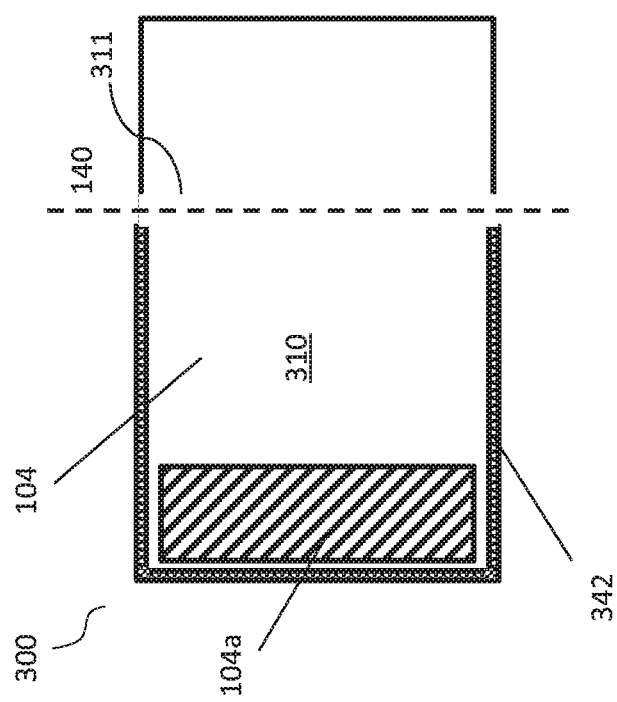

FIG. 16 illustrates a top view of the third semiconductor photonics wafer 300 after forming an uninterrupted groove 342.

As illustrated in FIG. 16, in Step 3003 of FIG. 19, the uninterrupted groove 342 is formed around the perimeter of a third semiconductor photonics chip 300a with a laser to prepare for sectioning it from the third semiconductor photonics wafer 300. For example, an uninterrupted groove 342 is formed around three sides of the third semiconductor photonics chip 300a, extending from one end of the scribe line 140 to the opposite end of the scribe line 140. In some embodiments, the uninterrupted groove 342 may be formed around the entire perimeter of the third semiconductor photonics chip 300a (not illustrated).

The uninterrupted groove 342 will define a third semiconductor photonics chip 300a. Because the uninterrupted groove 342 is uninterrupted, the laser is scanned continuously around each chip of the wafer without deactivation. The uninterrupted groove 342 may have a similar depth comparable to the plurality of grooves described in prior embodiments.

FIG. 17 illustrates the sectioning of the third semiconductor photonics chip 300a by a dicing blade cutting along scribe line 140 and around uninterrupted groove 342 (Step 3005 of FIG. 19). The dicing saw may be used along the scribe line 140 through the third cavity 310 without risk of chipping or delamination of the BEOL layer 104, since the BEOL layer 104 has already been removed along the scribe line 140 by etching the plurality of trenches 311.

As next illustrated in FIG. 18, an interposer may be attached to the photonic chip to form the photonic device (Step 3007 of FIG. 19). FIG. 18 illustrates the adiabatic coupling of the optical interposer 150 to a bottom surface of the third cavity 310. The adhesive material 222 may be used for the coupling. No laser ablation is performed along the plurality of trenches 311 due to the BEOL layer 104 being already removed. Because of this, no residual matter is present on the bottom surface of the third cavity 310 to impede the efficiency of the optical coupling between the third semiconductor photonics chip 300a and the third optical interposer 350.

Accordingly, in various embodiments described in this application, by avoiding the laser ablation process through the cavity supporting the interposer, excellent optical coupling between the interposer and the photonic chip is obtained.

In accordance with an embodiment, a plurality of grooves is produced using laser ablation. The plurality of grooves is formed along a scribe line along which the semiconductor photonics wafer will later be diced. The plurality of grooves ends at about the boundaries of the cavity so that the laser ablation does not leave raised residual material along the bottom of the cavity. The plurality of grooves may be produced by a laser beam that is intermittently turned ON and OFF during laser processing. A dicing blade is used to cut along the scribe line and divide the semiconductor photonics wafer. The optical interposer is then adiabatically coupled to the bottom surface of the cavity.

In accordance with another embodiment, a cavity with dimensions of sufficient size for the optical interposer assembly to rest on a bottom surface of the cavity is etched into the semiconductor photonics wafer. After a plurality of grooves along portions of a scribe line is produced, a partial saw cut is made along the entire scribe line, i.e. along the step laser groove and across the cavity. The optical interposer is coupled to the bottom surface of the cavity. The coupling may be performed with an adhesive material. The partial cut may act as a reservoir for the adhesive material. Another cut is made immediately below the partial saw cut to separate the portion of the semiconductor photonics wafer coupled to the optical interposer from the remaining portion of the semiconductor photonics wafer.

In accordance with still another embodiment, a cavity is etched into a semiconductor photonics wafer with portions of the cavity intersecting with a trench formed along a scribe line. An uninterrupted laser groove is formed along the perimeter of a semiconductor photonics chip, to be sectioned from the semiconductor photonics wafer, from the top of the scribe line to the bottom of the scribe line. The semiconductor photonics wafer may then be divided by a dicing saw along the scribe line through the extended cavity without risk of cracking of delamination of the BEOL layer, since the BEOL layer has already been removed along the scribe line by etching. After dicing the semiconductor photonics chip, the optical interposer may be coupled to the bottom surface of the cavity.

Example embodiments of the invention are summarized here. Other embodiments can also be understood from the entirety of the specification as well as the claims filed herein.

Example 1. A method of forming a photonic device, the method including: forming a cavity extending from a first major surface of a semiconductor wafer, the cavity including a first sidewall, an opposite second sidewall, and a bottom surface; performing a laser grooving process to form a first groove and a second groove, the first groove being separated from the second groove by the cavity; dicing the semiconductor wafer along the first groove and the second groove, the dicing passing through the cavity along a line connecting the first groove to the second groove; and attaching an optical interposer to the bottom surface of the cavity.

Example 2. The method of example 1, in which performing the laser grooving process further includes linearly scanning a laser beam from one edge of the first major surface to an opposite edge of the first major surface.

Example 3. The method of examples 1 and 2, in which performing the laser grooving process further includes activating the laser beam while forming the first groove, deactivating the laser beam while the scanning traverses between the first groove and the second groove, and reactivating the laser beam while forming the second groove.

Example 4. The method of example 1, in which forming the cavity includes using an etching process.

Example 5. The method of example 1, in which the optical interposer provides adiabatic coupling for the photonic device.

Example 6. The method of example 1, in which the optical interposer is attached to the bottom surface of the cavity such that the optical interposer overlays the bottom surface of the cavity and further protrudes beyond the bottom surface of the cavity.

Example 7. The method of example 1, in which attaching the optical interposer includes attaching the optical interposer after dicing the semiconductor wafer.

Example 8. The method of example 1, in which attaching the optical interposer includes applying an adhesive material over the bottom surface of the cavity, mounting the optical interposer, and curing the adhesive material.

Example 9. The method of example 1, in which attaching the optical interposer includes attaching the optical interposer before dicing the semiconductor wafer.

Example 10. The method of examples 1 and 9, further including: forming a partial cut using a dicing blade along the line connecting the first groove to the second groove, in which attaching the optical interposer further includes applying an adhesive material over the bottom surface of the cavity and collecting an excess of the adhesive material within the partial cut.

Example 11. The method of examples 1, 9, and 10, in which dicing the semiconductor wafer includes dicing the semiconductor wafer from a second major surface that is opposite to the first major surface.

Example 12. A method of forming a photonic device, the method including: forming a cavity extending from a first major surface of a semiconductor wafer, the cavity including a first sidewall, an opposite second sidewall, and a bottom surface; forming a first trench and a second trench, the first trench being separated from the second trench by the cavity; dicing the semiconductor wafer along the first trench and the second trench, the dicing passing through the cavity along a line connecting the first trench to the second trench; and attaching an optical interposer to the bottom surface of the cavity.

Example 13. The method of example 12, further including: performing a laser grooving process to form a first groove, a second groove, and a third groove surrounding the photonic device along scribe lines of the semiconductor wafer.

Example 14. The method of examples 12 and 13, in which forming the cavity and forming the first trench and the second trench are performed using the same process.

Example 15. The method of examples 12 and 13, in which forming the first trench and the second trench includes etching the first trench and the second trench.

Example 16. The method of examples 12 and 13, in which the cavity, the first trench, and the second trench have the same depth.

Example 17. A photonic device including: a major surface including a first cavity extending into the photonic device, the first cavity including sidewalls on a first side, a second side, and a third side, the first cavity being open on a fourth side; an optical interposer attached to a bottom surface of the first cavity; a first residual material disposed at a first side of the first cavity; and a second residual material disposed at a third side of the first cavity.

Example 18. The photonic device of example 17, further including: a second cavity disposed along the fourth side of the first cavity, the second cavity extending deeper into the photonic device than the first cavity.

Example 19. The photonic device of example 17, further including an adhesive material disposed between the bottom surface of the first cavity and the optical interposer, in which the adhesive material is disposed in the second cavity.

Example 20. The photonic device of example 17, in which the first residual material is disposed along a portion of the first side proximate to the fourth side.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a photonic device, the method comprising:
    forming, from a first side of a semiconductor wafer, a cavity extending from a first major surface of the semiconductor wafer, the cavity comprising a first sidewall, an opposite second sidewall, and a bottom surface;
    performing a laser grooving process to form, from the first side of the semiconductor wafer, a first groove and a second groove, the first groove being separated from the second groove along the first major surface by the cavity and extending into the semiconductor wafer from the first major surface, wherein the first groove intersects with the cavity at a first location and extends towards the cavity along a first direction on the first major surface, and wherein the second groove intersects with the cavity at a second location spaced apart from the first location by the cavity and extends towards the cavity along a second direction that is opposite to the first direction;
    dicing the semiconductor wafer along the first groove and the second groove, the dicing passing through the cavity along a line connecting the first groove to the second groove; and
    attaching an optical interposer to the bottom surface of the cavity.

2. The method of claim 1, wherein performing the laser grooving process further comprises linearly scanning a laser beam from one edge of the first major surface to an opposite edge of the first major surface.

3. The method of claim 2, wherein performing the laser grooving process further comprises activating the laser beam while forming the first groove, deactivating the laser beam while the scanning traverses between the first groove and the second groove, and reactivating the laser beam while forming the second groove.

4. The method of claim 1, wherein forming the cavity comprises using an etching process.

5. The method of claim 1, wherein the optical interposer provides adiabatic coupling for the photonic device.

6. The method of claim 1, wherein the optical interposer is attached to the bottom surface of the cavity such that the optical interposer overlays the bottom surface of the cavity and further protrudes beyond the bottom surface of the cavity.

7. The method of claim 1, wherein attaching the optical interposer comprises attaching the optical interposer after dicing the semiconductor wafer.

8. The method of claim 1, wherein attaching the optical interposer comprises applying an adhesive material over the bottom surface of the cavity, mounting the optical interposer, and curing the adhesive material.

9. The method of claim 1, wherein attaching the optical interposer comprises attaching the optical interposer before dicing the semiconductor wafer.

10. The method of claim 9, further comprising:
    forming a partial cut using a dicing blade along the line connecting the first groove to the second groove, wherein attaching the optical interposer further comprises applying an adhesive material over the bottom surface of the cavity and collecting an excess of the adhesive material within the partial cut.

11. The method of claim 10, wherein dicing the semiconductor wafer comprises dicing the semiconductor wafer from a second major surface that is opposite to the first major surface.

12. A method of forming a photonic device, the method comprising:
   forming, from a first side of a semiconductor wafer, a cavity extending from the first major surface of a semiconductor wafer, the cavity comprising a first sidewall, an opposite second sidewall, and a bottom surface;
   forming, from the first side of the semiconductor wafer, a first trench and a second trench, the first trench being separated from the second trench along the first major surface by the cavity and extending into the semiconductor wafer from the first major surface, wherein the first trench intersects with the cavity at a first location of the first sidewall and extends towards the first sidewall along a first direction on the first major surface, and wherein the second trench intersects with the cavity at a second location of the second sidewall and extends towards the cavity along a second direction that is opposite to the first direction;
   dicing the semiconductor wafer along the first trench and the second trench, the dicing passing through the cavity along a line connecting the first trench to the second trench; and
   attaching an optical interposer to the bottom surface of the cavity.

13. The method of claim 12, further comprising:
   performing a laser grooving process to form a first groove, a second groove, and a third groove surrounding the photonic device along scribe lines of the semiconductor wafer.

14. The method of claim 13, wherein forming the cavity and forming the first trench and the second trench are performed using the same process.

15. The method of claim 13, wherein forming the first trench and the second trench comprises etching the first trench and the second trench.

16. The method of claim 13, wherein the cavity, the first trench, and the second trench have the same depth.

17. The method of claim 1, wherein the first groove and the second groove are formed along the line connecting the first groove to the second groove, the line intersecting the cavity.

18. The method of claim 12, wherein the first trench is formed proximate a first side of the cavity and the second trench is formed proximate a second side of the cavity, the first side being opposite the second side.

19. The method of claim 1, wherein the first groove is formed proximate a first side of the cavity, a first residual material being deposited proximate the first groove, the second groove is formed proximate a second side of the cavity opposite the first, a second residual material being deposited proximate the second groove, and the laser grooving process further comprises deactivating a laser while passing it over the cavity.

20. The method of claim 1, wherein forming the cavity comprises etching the first major surface to form the cavity, wherein performing the laser grooving process to form the first groove and the second groove comprises forming a first groove into the first major surface proximate a first side of the cavity using a laser, a first residual material being deposited proximate the first groove; deactivating the laser while passing it over the cavity; and forming a second groove into the first major surface proximate a second side of the cavity opposite the first side using the laser, a second residual material being deposited proximate the second groove.

21. The method of claim 20, wherein forming the first groove, deactivating the laser while passing it over the cavity, and forming the second groove are performed sequentially while scanning the laser over the first major surface along a scribe line.

22. The method of claim 20, wherein the laser is operated at a scan velocity in a range of about 50 mm/s to about 250 mm/s.

23. The method of claim 20, wherein the laser is operated at a frequency in a range of about 50 KHz to about 250 KHz and at a power in a range of about 1 W to about 5 W.

* * * * *